United States Patent
Lian et al.

(10) Patent No.: US 12,245,403 B2
(45) Date of Patent: Mar. 4, 2025

(54) HEAT DISSIPATION CABINET AND COMMUNICATION DEVICE

(71) Applicant: HUAWEI DIGITAL POWER TECHNOLOGIES CO., LTD., Shenzhen (CN)

(72) Inventors: Zhisheng Lian, Dongguan (CN); Tao Feng, Shenzhen (CN); Shulong Xu, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 139 days.

(21) Appl. No.: 17/981,129

(22) Filed: Nov. 4, 2022

(65) Prior Publication Data

US 2023/0057893 A1 Feb. 23, 2023

Related U.S. Application Data

(63) Continuation of application No. PCT/CN2020/088796, filed on May 6, 2020.

(51) Int. Cl.
*H05K 7/20* (2006.01)
*H05K 5/02* (2006.01)

(52) U.S. Cl.
CPC ....... *H05K 7/20581* (2013.01); *H05K 5/0214* (2022.08); *H05K 5/0217* (2013.01)

(58) Field of Classification Search
None
See application file for complete search history.

(56) References Cited

U.S. PATENT DOCUMENTS 6,742,583 B2 * 6/2004 Tikka ............... H05K 7/206
165/291
6,776,706 B2 * 8/2004 Kipka ............... H05K 7/20181
55/467

(Continued)

FOREIGN PATENT DOCUMENTS

CN 102264212 A 11/2011
CN 202872368 U 4/2013

(Continued)

OTHER PUBLICATIONS

Extended European Search Report in European Appln No. 20934736.8, dated May 9, 2023, 11 pages.

(Continued)

*Primary Examiner* — Courtney L Smith
(74) *Attorney, Agent, or Firm* — Fish & Richardson P.C.

(57) ABSTRACT

The heat dissipation cabinet includes a cabinet body, a cabinet door, and a baffle. The cabinet body includes a top wall and a bottom wall that are oppositely disposed, and a side wall connected between the top wall and the bottom wall. The cabinet door is installed at a position of the side wall in the cabinet body, and an air outlet passage is disposed in the cabinet body that is close to a position of the top wall. An air inlet component and an air outlet component are disposed in the cabinet door, and the air outlet component is located between the air inlet component and the top wall, and is located at one end of the air outlet passage. An electronic apparatus placement area is disposed in the cabinet body, and the baffle is disposed between the electronic apparatus placement area and the cabinet door.

18 Claims, 13 Drawing Sheets

(56) References Cited

U.S. PATENT DOCUMENTS

| | | | |
|---|---|---|---|
| 7,974,094 B2* | 7/2011 | Hendrix | H05K 7/20563 |
| | | | 361/679.5 |
| 9,084,376 B2* | 7/2015 | Weiss | H05K 7/20163 |
| 9,545,037 B2* | 1/2017 | Tyleshevski | H05K 7/202 |
| 9,974,214 B2* | 5/2018 | Hamari | H05K 7/206 |
| 10,111,360 B2* | 10/2018 | Perrin | H02B 1/565 |
| 11,191,191 B2* | 11/2021 | Krippner | H05K 7/2039 |
| 2004/0007347 A1* | 1/2004 | Stoller | H05K 7/206 |
| | | | 165/47 |
| 2007/0171613 A1* | 7/2007 | McMahan | H05K 7/20736 |
| | | | 361/695 |
| 2011/0203770 A1* | 8/2011 | Rowe | H05K 7/202 |
| | | | 165/80.1 |
| 2012/0033379 A1 | 2/2012 | Lam et al. | |

FOREIGN PATENT DOCUMENTS

| | | |
|---|---|---|
| CN | 103269168 A | 8/2013 |
| CN | 204069569 U | 12/2014 |
| CN | 205071524 U | 3/2016 |
| CN | 207604050 U | 7/2018 |
| CN | 108495538 A | 9/2018 |
| CN | 108966597 A | 12/2018 |

OTHER PUBLICATIONS

International Search Report and Written Opinion in International Appln. No. PCT/CN2020/088796, mailed on Jan. 25, 2021, 15 pages (with English translation).

* cited by examiner

HEAT DISSIPATION CABINET AND COMMUNICATION DEVICE

CROSS-REFERENCE TO RELATED APPLICATIONS

This application is a continuation of International Application No. PCT/CN2020/088796, filed on May 6, 2020, the disclosure of which is hereby incorporated by reference in its entirety.

TECHNICAL FIELD

This application relates to the field of communication device technologies, and in particular, to a heat dissipation cabinet and a communication device.

BACKGROUND

Communication devices are increasingly installed in an outdoor environment. In a natural environment, a heat dissipation cabinet is configured to provide an outdoor physical working environment and safety assurance for a related device of a wireless communication station or a wired network station. A communication apparatus such as a base station apparatus, a power supply apparatus, and a transmission apparatus may be installed in the heat dissipation cabinet, and a heat dissipation effect of an electronic apparatus installed in the heat dissipation cabinet is ensured, so as to support normal operation of the electronic apparatus. A heat dissipation effect of an existing heat dissipation cabinet is limited, which causes poor heat dissipation of the electronic apparatus in the heat dissipation cabinet.

SUMMARY

Embodiments of this application provide a heat dissipation cabinet, so as to improve a heat dissipation effect of the heat dissipation cabinet, and ensure a heat dissipation effect of an electronic apparatus in the heat dissipation cabinet.

Embodiments of this application further provide a communication device.

According to a first aspect, an embodiment of this application provides a heat dissipation cabinet, and the heat dissipation cabinet includes a cabinet body, a cabinet door, and a baffle. The cabinet body includes a top wall and a bottom wall that are oppositely disposed, and a side wall connected between the top wall and the bottom wall. The cabinet door is installed at a position of the side wall in the cabinet body, and an air outlet passage is disposed in the cabinet body that is close to a position of the top wall. An air inlet component and an air outlet component are disposed in the cabinet door, and the air outlet component is located between the air inlet component and the top wall, and is located at one end of the air outlet passage. An electronic apparatus placement area is disposed in the cabinet body, and the baffle is disposed between the electronic apparatus placement area and the cabinet door. The baffle includes a first opening, so that air that enters through the air inlet component directly enters the electronic apparatus placement area through the first opening.

In the heat dissipation cabinet in this embodiment of this application, the baffle is disposed between the electronic apparatus placement area and the cabinet door, so that the air that enters through the air inlet component directly enters the electronic apparatus placement area through the first opening, so as to cool an electronic apparatus disposed in the electronic apparatus placement area. In addition, the air outlet passage is disposed at the position of the cabinet body that is close to the top wall, so that air that passes through the electronic apparatus is led from the air outlet passage to the air outlet component, and further the air (hot air) that passes through the electronic apparatus is discharged out of the cabinet body through the air outlet component. That is, the air outlet passage in this application can quickly and effectively collect and discharge the heated air that passes through the electronic apparatus out of the cabinet body, thereby effectively improving a heat dissipation effect of the heat dissipation cabinet and ensuring electrical performance of the electronic apparatus disposed in the heat dissipation cabinet. In other words, in this application, external air (cold air) is directly introducing into the electronic apparatus placement area by using the baffle, so as to prevent the external air from diffusing in any direction in the cabinet body, and finally entering the electronic apparatus placement area. In this process, temperature of the external air rises gradually, and finally, when the external air arrives at the electronic apparatus placement area, there is a problem that the heat dissipation effect of the electronic apparatus in the electronic apparatus placement area is not good. Directly introducing the external air into the electronic apparatus placement area can effectively prevent the air from heating up in a process in which the air does not enter the electronic apparatus placement area, and by disposing the air outlet passage, air (hot air) that passes through the electronic apparatus placement area can be rapidly discharged out of the cabinet body, thereby effectively preventing the hot air from flowing back to the electronic apparatus placement area, improving the heat dissipation effect of the electronic apparatus in the electronic apparatus placement area, and ensuring effective operation of the electronic apparatus. The baffle can further prevent the air (hot air) that passes through the electronic apparatus placement area from flowing back and mixing with the air (cold air) that enters from the air inlet component, thereby greatly improving the heat dissipation effect of the heat dissipation cabinet. Both the air inlet component and the air outlet component in this application are disposed on the cabinet door, which facilitates maintenance, simplifies a structure of the side wall, and reduces production costs and maintenance costs.

According to the first aspect, in a possible implementation of the heat dissipation cabinet, the air outlet passage includes a body and an air duct that penetrates the body. Two opposite ends of the body include a second opening and a third opening that communicate with the air duct, the second opening communicates with the air outlet component, and the third opening is located above the electronic apparatus placement area. The above part of the electronic apparatus disposition area is in a direction in which the electronic apparatus disposition area faces toward the top wall. The third opening is located between the top wall and the electronic apparatus placement area, so as to quickly collect and discharge the air that passes through the electronic apparatus placement area out of the cabinet body through the air duct, and prevent hot air from flowing back to the electronic apparatus placement area. In addition, air that enters the air duct is isolated from air outside the air duct, thereby effectively improving the heat dissipation effect of the heat dissipation cabinet.

According to the first aspect, in a possible implementation of the heat dissipation cabinet, the second opening and the third opening are disposed opposite to each other in a direction toward the cabinet door, so as to quickly collect and discharge the air that passes through the electronic apparatus placement area out of the cabinet body through the third opening, and prevent hot air from flowing back to the electronic apparatus placement area, thereby effectively improving the heat dissipation effect of the heat dissipation cabinet.

According to the first aspect, in a possible implementation of the heat dissipation cabinet, the third opening is disposed toward the electronic apparatus placement area, that is, the third opening is disposed toward the air that passes through the electronic apparatus placement area, so as to effectively and quickly collect and discharge the air that passes through the electronic apparatus placement area out of the cabinet body, and prevent hot air from flowing back to the electronic apparatus placement area, thereby effectively improving the heat dissipation effect of the heat dissipation cabinet.

According to the first aspect, in a possible implementation of the heat dissipation cabinet, at least one extractor fan is disposed in the air outlet passage, and is configured to extract the air that passes through the electronic apparatus placement area. The extractor fan is disposed in the air outlet passage, so as to more effectively and quickly collect and discharge the air that passes through the electronic apparatus placement area out of the cabinet body, thereby improving a heat dissipation effect of the electronic apparatus in the electronic apparatus placement area.

According to the first aspect, in a possible implementation of the heat dissipation cabinet, the baffle includes a first baffle and a second baffle, and the first opening is located between the first baffle and the second baffle. The first baffle is disposed adjacent to the body, and the second baffle is located between the first baffle area and the bottom wall. That is, in this application, the first opening that exposes the electronic apparatus placement area is formed by disposing the first baffle and the second baffle at an interval, so that external air is directly introduced into the electronic apparatus placement area through the first opening, which can effectively prevent the air from heating up in a process in which the air does not enter the electronic apparatus placement area, and improve the heat dissipation effect of the electronic apparatus in the electronic apparatus placement area. The first baffle and the second baffle can further prevent the air that passes through the electronic apparatus placement area from flowing back and mixing with the air that enters from the air inlet component to heat the air that enters from the air inlet component, thereby greatly improving the heat dissipation effect of the heat dissipation cabinet.

According to the first aspect, in a possible implementation of the heat dissipation cabinet, a width of the first opening in a direction from the bottom wall to the top wall is less than or equal to a width of the electronic apparatus placement area from the bottom wall to the top wall, so as to effectively avoid a case that the air does not directly enter the electronic apparatus placement area caused by an excessive large first opening, and prevent the air that passes through the electronic apparatus placement area from flowing back and mixing with the air that enters from the air inlet component to heat the air that enters from the air inlet component, thereby effectively improving the heat dissipation effect of the heat dissipation cabinet.

According to the first aspect, in a possible implementation of the heat dissipation cabinet, a gap is formed between the side wall and each of the first baffle and the second baffle, so that the air that enters through the air inlet component enters the electronic apparatus placement area through the gap. For the electronic apparatus in which a direction of an internal air duct is parallel to a direction between two side walls that are connected to the cabinet door, the air that enters through the air inlet component enters the position of the side wall of the cabinet body by passing through the first baffle and the second baffle and bypassing the gap, and then enters the internal air duct of the electronic apparatus, so as to quickly cool the electronic apparatus. That is, the air in this application enters the electronic apparatus along the internal air duct of the electronic apparatus for heat dissipation, so as to effectively and quickly cool the electronic apparatus, and improve the heat dissipation effect of the electronic apparatus. In addition, the first baffle and the second baffle can further prevent the air that passes through the electronic apparatus placement area from flowing back and mixing with the air that enters from the air inlet component to heat the air that enters from the air inlet component, thereby greatly improving the heat dissipation effect of the heat dissipation cabinet.

According to the first aspect, in a possible implementation of the heat dissipation cabinet, the air inlet component includes a first mask and an air inlet fan, where the first mask includes accommodating space, and a fourth opening and a fifth opening that are located at two opposite ends of the first mask and communicate with the accommodating space, the air inlet fan is disposed on the fifth opening side, and the air inlet fan draws air outside the cabinet body into the cabinet body That is, the air is drawn into the cabinet body through the air inlet component, that is, a positive pressure system is in the cabinet body. The air that enters the cabinet body heats up after passing through the electronic apparatus placement area, flows toward the top wall, and then is discharged out of the cabinet body through the air outlet component that is located close to the top wall. If the fan is disposed in the air outlet component, that is, the fan is configured to extract the air in the cabinet body, to form a negative pressure system in the cabinet body, the external air is drawn into the cabinet body through the air inlet component under a negative pressure effect. For the negative pressure system, the air not only can enter the cabinet body through the air inlet component, but also may enter the cabinet body through another screw hole in the cabinet body. Therefore, dust and water outside the cabinet body are drawn into the cabinet body through a hole such as a screw hole and a cable hole, which affects performance of an apparatus in the cabinet body. The positive pressure system in this application can effectively prevent the air from entering the cabinet body through a hole other than the air inlet component, and can effectively prevent the dust and the water outside the cabinet body from being drawn into the cabinet body through a hole such as a screw hole and a cable hole, thereby ensuring the performance of the apparatus in the cabinet body.

According to the first aspect, in a possible implementation of the heat dissipation cabinet, a part of the first mask is located on an inner side of the cabinet door, and a part thereof is located on an outer side of the cabinet door. The fourth opening is located on the outer side of the cabinet door, and the fifth opening is located on the inner side of the cabinet door. Therefore, the air inlet component does not occupy excessive space in the cabinet body, and a capacity of the cabinet body is ensured. In addition, a part of the air inlet component protrudes from the outer side of the cabinet door, so as to ensure a clean appearance of the heat dissipation cabinet, and facilitate transportation of the heat dissipation cabinet, thereby avoiding bump and damage of the air inlet component during transportation and use.

According to the first aspect, in a possible implementation of the heat dissipation cabinet, the first mask is located on an inner side of the cabinet door, and the fourth opening communicates with the air inlet of the cabinet door. That is, the air inlet component does not protrude from an outer side of the cabinet door, so as to ensure a clean appearance of the heat dissipation cabinet, thereby avoiding bump and damage of the air inlet component during transportation and use. Alternatively, the first mask is located on an outer side of the cabinet door, and the fifth opening communicates with the air inlet of the cabinet door. That is, the air inlet component does not occupy space in the cabinet body, so as to ensure that the space in the cabinet body is large enough to meet a large capacity requirement of a customer.

According to the first aspect, in a possible implementation of the heat dissipation cabinet, the air inlet component further includes a filter, and the filter is located in the accommodating space and is located on a side of the air inlet fan that faces toward the fifth opening. The filter is configured to filter impurity in the external air, so as to prevent the impurity from entering the cabinet body and affecting the electrical performance of the electronic apparatus in the cabinet body, thereby improving service life of the electronic apparatus.

According to the first aspect, in a possible implementation of the heat dissipation cabinet, the filter includes a dustproof part and a first waterproof part, and the dustproof part is disposed closer to the air inlet fan relative to the first waterproof part, or the first waterproof part is disposed closer to the air inlet fan relative to the dustproof part. Therefore, dust and water are effectively prevented from entering the cabinet body, and the electrical performance of the electronic apparatus in the cabinet body is prevented from being affected by the dust and the water, thereby improving the service life of the electronic apparatus.

According to the first aspect, in a possible implementation of the heat dissipation cabinet, the air outlet component includes a second waterproof part, and the second waterproof part is configured to prevent water from entering the cabinet body, so as to prevent the water from affecting the electrical performance of the electronic apparatus in the cabinet body, and improve the service life of the electronic apparatus.

According to the first aspect, in a possible implementation of the heat dissipation cabinet, there are a plurality of air outlet components and air inlet components, so as to implement different heat dissipation requirements.

According to the first aspect, in a possible implementation of the heat dissipation cabinet, the heat dissipation cabinet includes a temperature sensor and a controller, the temperature sensor is disposed in the electronic apparatus placement area, and the controller is electrically connected to the temperature sensor and the air inlet fan, so as to control a rotation speed of the air inlet fan based on temperature of the electronic apparatus.

According to the first aspect, in a possible implementation of the heat dissipation cabinet, the cabinet door is connected to a first cover plate and a second cover plate, the first cover plate is configured to open or close the air outlet component, and the second cover plate is configured to open or close the air inlet component, that is, the air inlet component or the air outlet component that is not in use may be closed, so as to ensure sealing in the cabinet body, effectively control air flow in the cabinet body, improve the heat dissipation effect of the heat dissipation cabinet, and reduce energy consumption of the heat dissipation cabinet during use, thereby reducing use costs.

According to the first aspect, in a possible implementation of the heat dissipation cabinet, a driving part is disposed in the cabinet door, and the driving part is connected to the controller, the first cover plate, and the second cover plate to drive the first cover plate and the second cover plate to respectively open or close the air outlet component and the air inlet component, so that the first cover plate and the second cover plate can be automatically controlled by the controller, and user experience is improved.

According to the first aspect, in a possible implementation of the heat dissipation cabinet, the heat dissipation cabinet further includes a bearing frame, the bearing frame is installed in the cabinet body, an area of the bearing frame that is used to dispose a related electronic apparatus is the electronic apparatus placement area, and the body is fixed to a part of the bearing frame that is close to the top wall. That is, the bearing frame can assist in installing the electronic apparatus, and is further configured to fix the body, so as to avoid introducing a new structure to fix the body, simplify a structure of the heat dissipation cabinet, and reduce production costs of the heat dissipation cabinet.

According to the first aspect, in a possible implementation of the heat dissipation cabinet, the heat dissipation cabinet further includes an auxiliary air outlet component, and the auxiliary air outlet component is disposed in the middle of the cabinet door. That is, air that passes through the electronic apparatus located on the bottom wall can be discharged out of the cabinet body through the auxiliary air outlet component, so as to prevent hot air from being transmitted step by step between different electronic apparatuses and further affecting heat dissipation effects of other electronic apparatuses, thereby effectively improving an overall heat dissipation effect of a plurality of electronic apparatuses.

According to a second aspect, an embodiment of this application provides a communication device, where the communication device includes an electronic apparatus and the heat dissipation cabinet according to any one of the foregoing possible implementations of the first aspect, and the electronic apparatus is disposed in the electronic apparatus placement area of the heat dissipation cabinet. The communication device has a good heat dissipation effect and excellent electrical performance.

In the heat dissipation cabinet in embodiments of this application, the baffle is disposed between the electronic apparatus placement area and the cabinet door, so that the air that enters through the air inlet component directly enters the electronic apparatus placement area through the first opening, so as to cool the electronic apparatus disposed in the electronic apparatus placement area. In addition, the air outlet passage is disposed at the position of the cabinet body that is close to the top wall, so that air that passes through the electronic apparatus is led from the air outlet passage to the air outlet component, and further the air (hot air) that passes through the electronic apparatus is discharged out of the cabinet body through the air outlet component. That is, the air outlet passage in this application can quickly and effectively collect and discharge the heated air that passes through the electronic apparatus out of the cabinet body, thereby effectively improving a heat dissipation effect of the heat dissipation cabinet and ensuring electrical performance of the electronic apparatus disposed in the heat dissipation cabinet. In other words, in this application, external air (cold air) is directly introducing into the electronic apparatus placement area by using the baffle, so as to prevent the external air from diffusing in any direction in the cabinet body, and finally entering the electronic apparatus placement area. In this process, temperature of the external air rises gradually, and finally, when the external air arrives at the electronic apparatus placement area, there is a problem that the heat dissipation effect of the electronic apparatus in the electronic apparatus placement area is not good. Directly introducing the external air into the electronic apparatus placement area can effectively prevent the air from heating up in a process in which the air does not enter the electronic apparatus placement area, and by disposing the air outlet passage, air (hot air) that passes through the electronic apparatus placement area can be rapidly discharged out of the cabinet body, thereby effectively preventing the hot air from flowing back to the electronic apparatus placement area, improving the heat dissipation effect of the electronic apparatus in the electronic apparatus placement area, and ensuring effective operation of the electronic apparatus.

DESCRIPTION OF EMBODIMENTS

The following describes embodiments of this application with reference to accompanying drawings in embodiments of this application.

Figure 1:
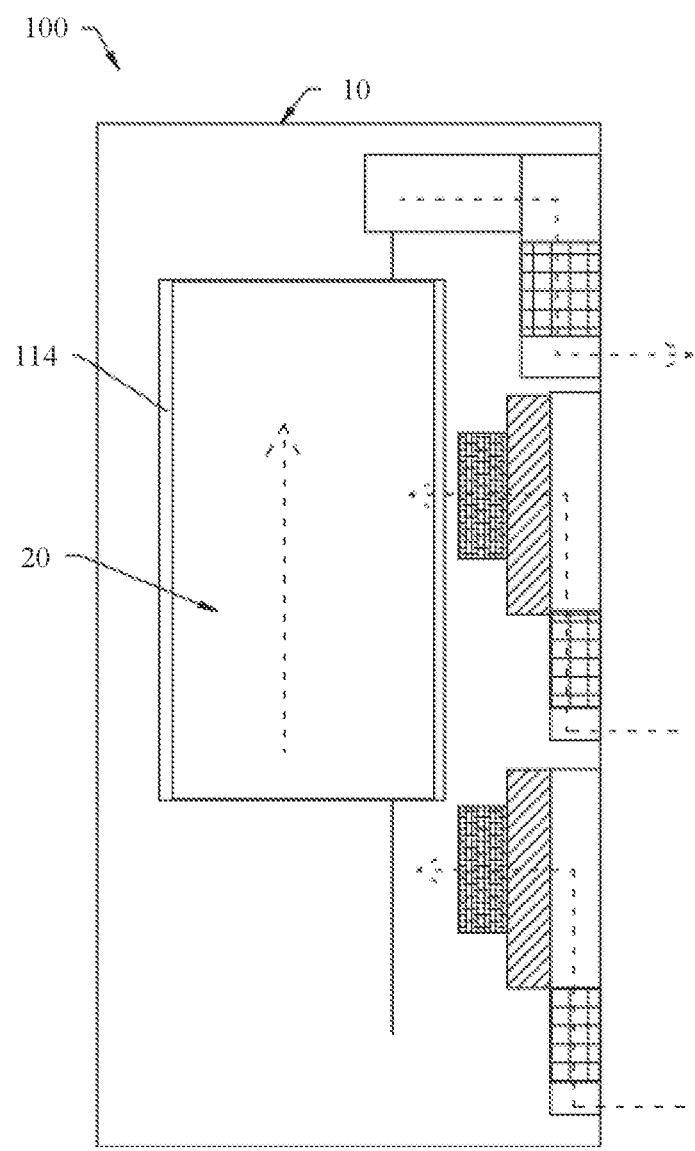
FIG. 1 is a schematic diagram of a structure of a communication device according to an embodiment of this application.

FIG. 1 is a schematic diagram of a structure of a communication device according to an embodiment of this application. A communication device 100 includes a heat dissipation cabinet 10 and an electronic apparatus 20, and the electronic apparatus 20 is disposed in an electronic apparatus placement area 114 of the heat dissipation cabinet 10. In this embodiment, the communication device 100 is a workstation such as a wireless communication station or a network workstation, and the electronic apparatus 20 may include one or more of a base station apparatus, a power supply apparatus, a battery, a transmission apparatus, and the like. The electronic apparatus 20 is disposed in the heat dissipation cabinet 10, which can ensure that the electronic apparatus 20 has a good heat dissipation effect and excellent electrical performance.

Figure 2:
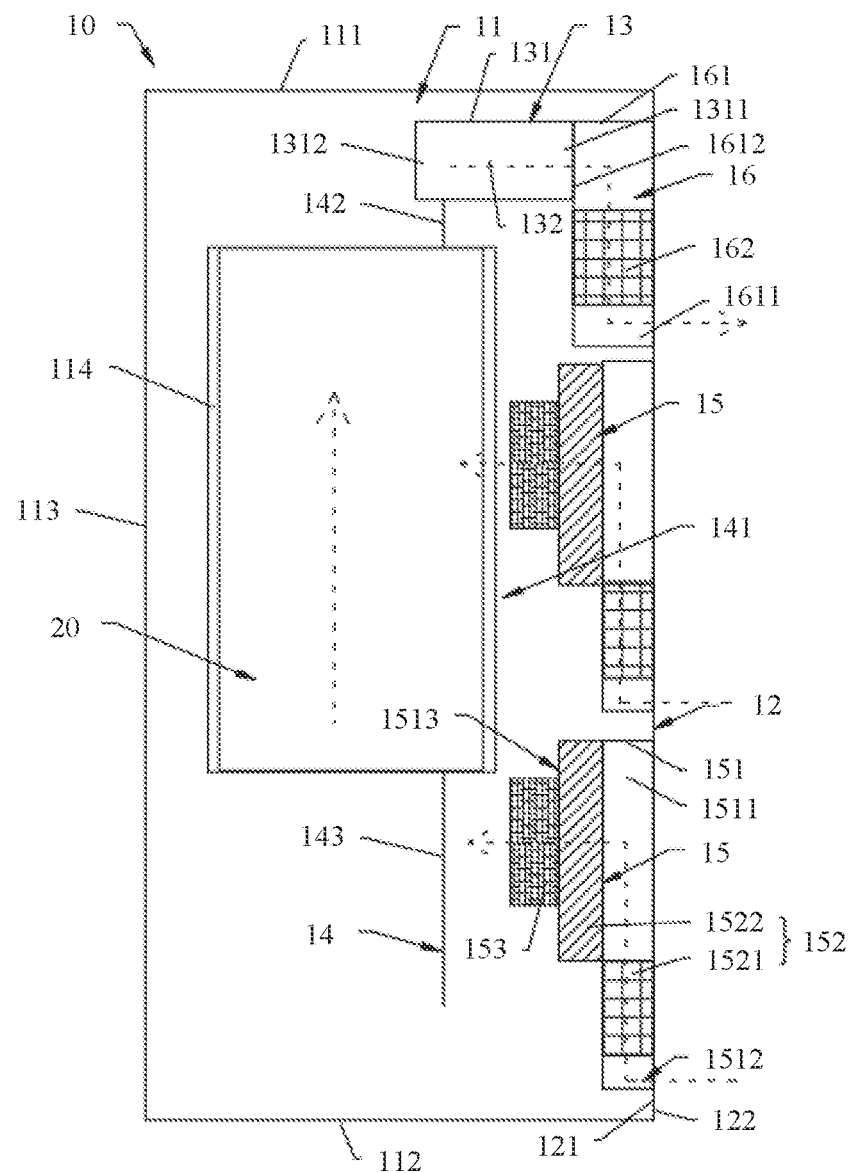
FIG. 2 is a schematic diagram of a structure of a first embodiment of a heat dissipation cabinet according to an embodiment of this application.
Figure 3:
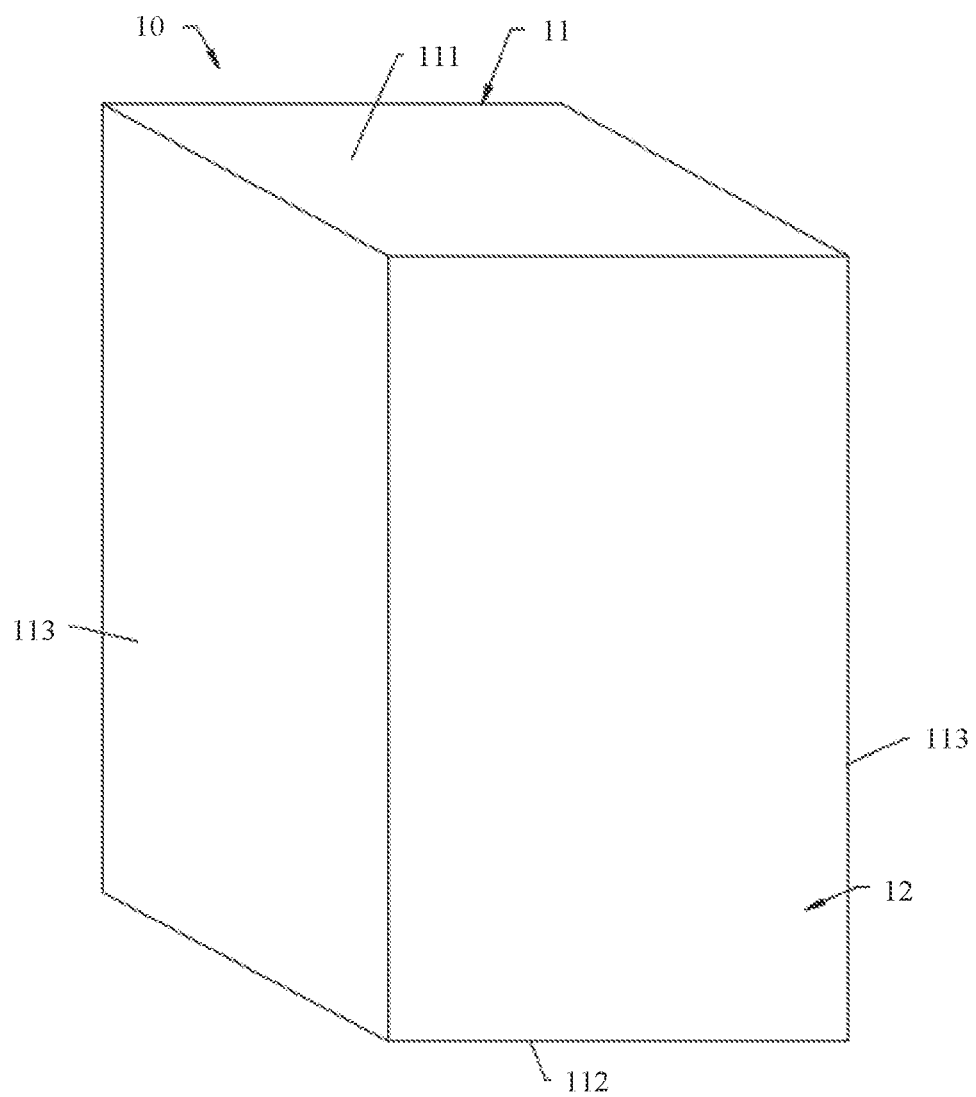
FIG. 3 is a schematic diagram of a structure of the heat dissipation cabinet according to FIG. 2 from another angle.

FIG. 2 is a schematic diagram of a structure of a first embodiment of a heat dissipation cabinet according to an embodiment of this application. FIG. 3 is a schematic diagram of a structure of the heat dissipation cabinet according to FIG. 2 from another angle. A heat dissipation cabinet 10 includes a cabinet body 11, a cabinet door 12, an air outlet passage 13, and a baffle 14. The cabinet body 11 includes a top wall 111 and a bottom wall 112 that are oppositely disposed, and a side wall 113 connected between the top wall 111 and the bottom wall 112. The cabinet door 12 is installed at a position of the side wall 113 in the cabinet body 11, and can be opened and closed relative to the cabinet body 11. The air outlet passage 13 is disposed in the cabinet body 11 and is close to the top wall 111. An air inlet component 15 and an air outlet component 16 are disposed in the cabinet door 12. The air outlet component 16 is located between the air inlet component 15 and the top wall 111, and is located at one end of the air outlet passage 13. The electronic apparatus placement area 114 is disposed in the cabinet body 11, and the electronic apparatus placement area 114 is located on a side of the air outlet passage 13 that is close to the bottom wall 112. The baffle 14 is disposed between the electronic apparatus placement area 114 and the cabinet door 12, and the baffle 14 includes a first opening 141, so that air that enters through the air inlet component 15 directly enters the electronic apparatus placement area 114 through the first opening 141.

In the heat dissipation cabinet 10 in this embodiment of this application, the baffle 14 is disposed between the electronic apparatus placement area 114 and the cabinet door 12, so that the air that enters through the air inlet component 15 directly enters the electronic apparatus placement area 114 through the first opening 141, so as to cool the electronic apparatus 20 disposed in the electronic apparatus placement area 114 (an arrow in FIG. 2 indicates an approximate flow direction of air in the cabinet body 11). In addition, the air outlet passage 13 is disposed at a position of the cabinet body 11 that is close to the top wall 111, so that air that passes through the electronic apparatus 20 is led from the air outlet passage 13 to the air outlet component 16, and further the air (hot air) that passes through the electronic apparatus 20 is discharged out of the cabinet body 11 through the air outlet component 16. That is, the air outlet passage 13 in this application can quickly and effectively collect and discharge the heated air that passes through the electronic apparatus 20 out of the cabinet body 11, thereby effectively improving a heat dissipation effect of the heat dissipation cabinet 10 and ensuring the electrical performance of the electronic apparatus 20 disposed in the heat dissipation cabinet 10. In other words, in this application, external air (cold air) is directly introducing into the electronic apparatus placement area 114 by using the baffle 14, so as to prevent the external air from diffusing in any direction in the cabinet body 11, and finally entering the electronic apparatus placement area 114. In this process, temperature of the external air rises gradually, and finally, when the external air arrives at the electronic apparatus placement area 20, there is a problem that the heat dissipation effect of the electronic apparatus 20 in the electronic apparatus placement area 114 is not good. Directly introducing the external air into the electronic apparatus placement area 114 can effectively prevent the air from heating up in a process in which the air does not enter the electronic apparatus placement area 114, and by disposing the air outlet passage 13, air (hot air) that passes through the electronic apparatus placement area 114 can be rapidly discharged out of the cabinet body 11, thereby effectively preventing the hot air from flowing back to the electronic apparatus placement area 114, improving the heat dissipation effect of the electronic apparatus 20 in the electronic apparatus placement area 114, and ensuring effective operation of the electronic apparatus 20. The baffle 14 can further prevent the air (hot air) that passes through the electronic apparatus placement area 114 from flowing back and mixing with the air (cold air) that enters from the air inlet component 15, thereby greatly improving the heat dissipation effect of the heat dissipation cabinet 10. Both the air inlet component 15 and the air outlet component 16 in this application are disposed on the cabinet door 12, which facilitates maintenance, simplifies a structure of the side wall 113, and reduces production costs and maintenance costs.

As shown in FIG. 2 and FIG. 3, a shape of the cabinet body 11 is a square cylinder. Specifically, there are three side walls 113, and the three side walls 113 are sequentially connected to each other and form accommodating space with the top wall 111 and the bottom wall 112 to accommodate the electronic apparatus 20. The cabinet door 12 is disposed on the side wall 113 at an opening of the accommodating space, and is opened or closed relative to the cabinet body 11 to open or close the accommodating space. A bearing frame (not shown in the figure) is disposed in the cabinet body 11, and the bearing frame is, for example, formed by a plurality of square hole bars. An area of the bearing frame that is used to dispose the electronic apparatus 20 is the electronic apparatus placement area 114, and the bearing frame is configured to install the electronic apparatus 20, so that the electronic apparatus 20 is firmly disposed in the cabinet body 11. Certainly, in another embodiment, the bearing frame is not limited to the foregoing description, provided that the electronic apparatus 20 can be fastened or borne.

The cabinet door 12 is plate-shaped, is disposed on the side wall 113 by using a rotating structure such as a hinge, and may be opened or closed relative to the opening of the accommodating space. The cabinet door 12 includes an inner side 121 and an outer side 122. The inner side 121 faces toward the accommodating space, and the outer side 122 faces away from the accommodating space. An air inlet and an air outlet that penetrate the inner side 121 and the outer side 122 are disposed on cabinet door 12. The air inlet communicates with the air inlet component 15, and the air outlet communicates with the air outlet component 16, so that air outside the cabinet body 11 enters the cabinet body 11 through the air inlet component 15, and air inside the cabinet body 11 is discharged out of the cabinet body 11 through the air outlet component 16, thereby ensuring the heat dissipation performance of the heat dissipation cabinet 10.

In this embodiment, there are two air inlet components 15, and the two air inlet components 15 are disposed on the cabinet door 12 at an interval. The air inlet component 15 includes a first mask 151, a filter 152, and an air inlet fan 153. The first mask 151 includes accommodating space 1511, and a fourth opening 1512 and a fifth opening 1513 that are located at two opposite ends of the first mask 151 and that communicate with the accommodating space 1511. The air inlet fan 153 is disposed on the fifth opening 1513 side, the filter 152 is located in the accommodating space 1511, and is located on a side of the air inlet fan 153 that faces toward the fifth opening 1513. The air inlet fan 153 draws the air outside the cabinet body 11 into the cabinet body 11. Specifically, the first mask 151 is located on the inner side 121 of the cabinet door 12, and the fourth opening 1512 communicates with the air inlet of the cabinet door 12. That is, the air inlet component 15 does not protrude from the outer side 122 of the cabinet door 12, so as to ensure a clean appearance of the heat dissipation cabinet 10, and avoid bump and damage of the air inlet component 15 during transportation and use. The filter 152 is configured to filter impurity in the external air, so as to prevent the impurity from entering the cabinet body 11 and affecting the electrical performance of the electronic apparatus 20 in the cabinet body 11, thereby improving service life of the electronic apparatus 20. Certainly, in another embodiment, a quantity of air inlet components 15 may be set based on an actual requirement, so as to implement different heat dissipation requirements. The air inlet component 15 may switch to an air outlet component by removing a fan as required. The air inlet component 15 may alternatively be disposed on the outer side 122 of the cabinet door 12, or a part of the air inlet component 15 is located on the inner side 121 of the cabinet door 12, and a part thereof is located on the outer side 122 of the cabinet door 12.

Figure 4:
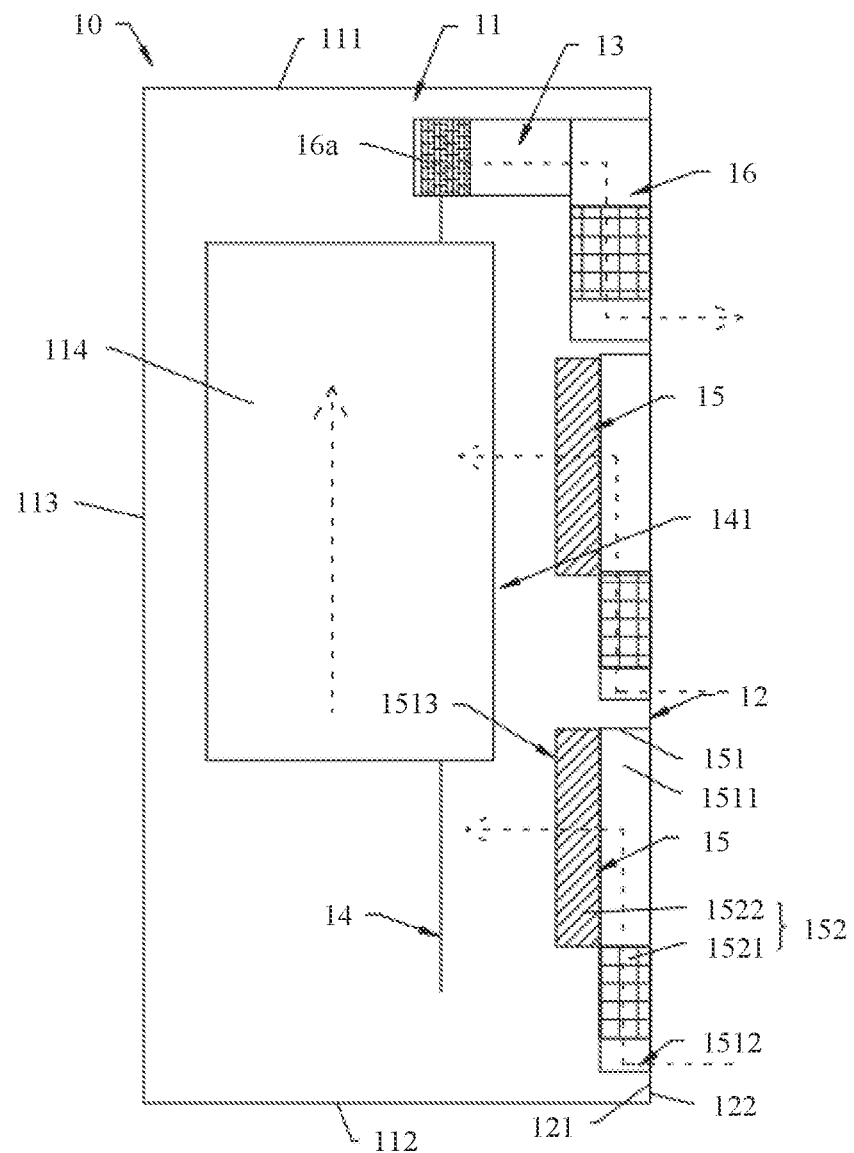
FIG. 4 is a schematic diagram of a structure of a negative pressure system of a heat dissipation cabinet.

In this embodiment, the air is drawn into the cabinet body 11 through the air inlet component 15, that is, a positive pressure system is in the cabinet body 11. The air that enters the cabinet body 11 heats up after passing through the electronic apparatus placement area 114, flows toward the top wall 111, and then is discharged out of the cabinet body 11 through the air outlet component 16 that is located close to the top wall 111. If a fan 16a is disposed in the air outlet passage 13 (as shown in FIG. 4) or the air outlet component 16, that is, the fan 16a is configured to extract the air in the cabinet body 11, so as to form a negative pressure system in the cabinet body 11, the external air is drawn into the cabinet body 11 through the air inlet component 15 under a negative pressure effect. For the negative pressure system, the air not only can enter the cabinet body 11 through the air inlet component 15, but also may enter the cabinet body 11 through another screw hole in the cabinet body 11. Therefore, dust and water outside the cabinet body 11 are drawn into the cabinet body 11 through a hole such as a screw hole and a cable hole, which affects performance of an apparatus in the cabinet body 11. The positive pressure system in this application can effectively prevent the air from entering the cabinet body 11 through a hole other than the air inlet component 15, and can effectively prevent the dust and the water outside the cabinet body 11 from being drawn into the cabinet body 11 through a hole such as a screw hole and a cable hole, thereby ensuring the performance of the apparatus in the cabinet body 11. Certainly, in another embodiment, the air inlet fan may alternatively be removed, and an air outlet fan is disposed on the air outlet component 16, so that the heat dissipation cabinet 10 of the positive pressure system is switched to a heat dissipation cabinet of the negative pressure system.

As shown in FIG. 2, the filter 152 includes a dustproof part 1521 and a first waterproof part 1522. In this embodiment, for example, the dustproof part 1521 is a dustproof structure such as a dust filter, and the first waterproof part 1522 is a waterproof structure such as a water barrier. The dustproof part 1521 is disposed closer to the air inlet fan 153 relative to the first waterproof part 1522, that is, the first waterproof part 1522 is disposed close to the fourth opening 1512, that is, the first waterproof part 1522 is disposed close to the external air. Therefore, water and dust are effectively prevented from entering the cabinet body 11, so as to prevent water and dust from affecting the electrical performance of the electronic apparatus 20 in the cabinet body 11, and improve service life of the electronic apparatus 20. Certainly, in another embodiment, the first waterproof part 1522 is disposed closer to the air inlet fan 153 relative to the dustproof part 1521.

The baffle 14 includes a first baffle 142 and a second baffle 143. Both the first baffle 142 and the second baffle 143 are plate-shaped. The first opening 141 is disposed between the first baffle 142 and the second baffle 143, that is, the first baffle 142 and the second baffle 143 are disposed at an interval to form the first opening 141 that exposes the electronic apparatus placement area 114, the first baffle 142 is disposed adjacent to the air outlet passage 13, and the second baffle 143 is disposed between the first baffle 142 and the bottom wall 112. Specifically, a side of the first baffle 142 that is close to the air outlet passage 13 is connected to the air outlet passage 13, so as to cooperate with the air outlet passage 13 to avoid a case that the air that enters from the air inlet component 15 is directly discharged from the air outlet component 16 without passing through the electronic apparatus placement area 114. Both the first baffle 142 and the second baffle 143 are fixed to the bearing frame, and are detachably connected to the bearing frame. The first baffle 142 and the second baffle 143 may further be formed by a plurality of sub-baffles (not shown in the figure). A size of the first opening 141 may be determined based on a volume of the electronic apparatus 20. The size of the first opening 141 is changed by changing a quantity of sub-baffles of the first baffle 142 and the second baffle 143, so that the size of the first opening 141 can be set based on an actual requirement. Certainly, in another embodiment, the first baffle 142 and the second baffle 143 may be alternatively disposed on another structure in the cabinet body 11.

Figure 5:
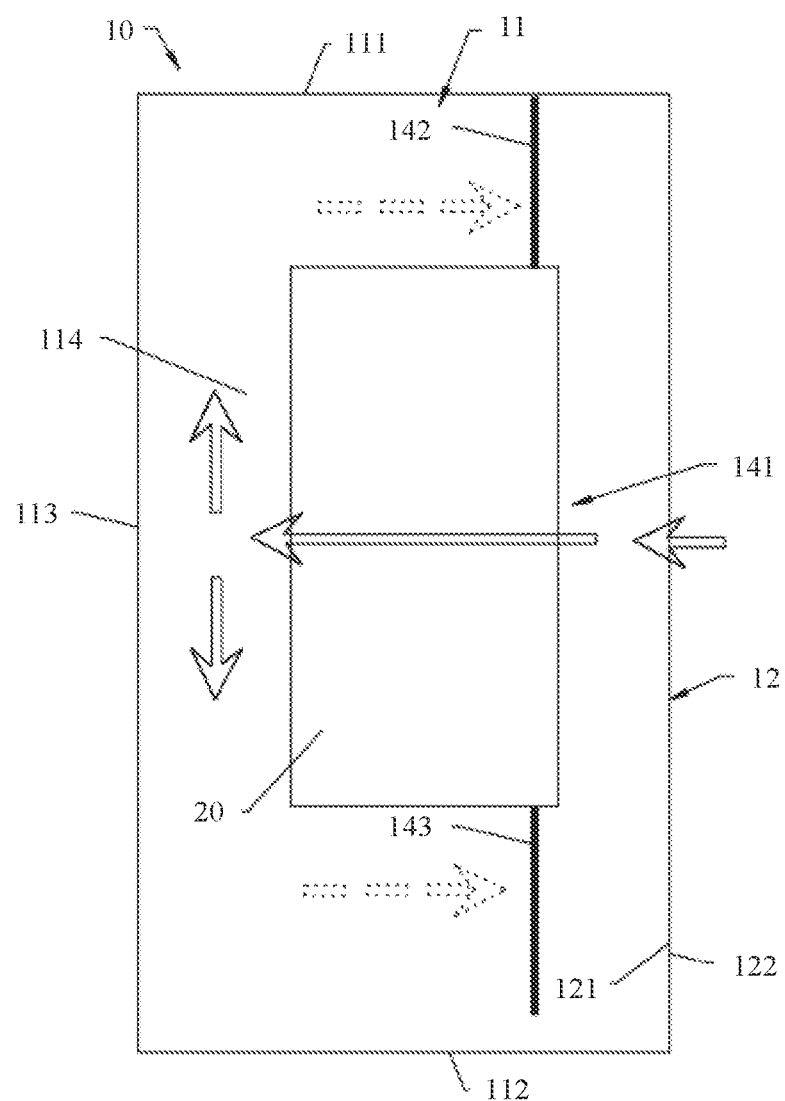
FIG. 5 is a schematic diagram of a flow direction of air in a cabinet body.

FIG. 5 is a schematic diagram of a flow direction of air in a cabinet body. Some structures of the heat dissipation cabinet 10 are not shown in FIG. 5. Please refer to FIG. 2. A direction of an internal air duct of the electronic apparatus 20 in FIG. 5 is a direction from the cabinet door 12 to the side wall 113 disposed opposite to the cabinet door 12. It may be understood that, for example, the cabinet door 12 is a front side, the side wall 113 disposed opposite to the cabinet door 12 is a rear side, and the direction of the internal air duct of the electronic apparatus 20 is a direction from the front side to the rear side. When the electronic apparatus 20 is cooled, the external air enters the internal air duct of the electronic apparatus 20 through the first opening 141 after passing through the air inlet component 15 (a solid arrow part in FIG. 5), so as to cool the electronic apparatus 20. After the air that passes through the electronic apparatus 20 is discharged from the electronic apparatus 20, some may flow back through an upper side and a lower side of the electronic apparatus 20, that is, through a side that faces toward the top wall 111 and a side that faces toward the bottom wall 112 (a dashed arrow part in FIG. 5). The back-flow air cannot mix with the air that enters from the air inlet component 15 because of disposing of the first baffle 142 and the second baffle 143. It may be understood that the first opening 141 is formed by using the first baffle 142 and the second baffle 143, so that external air is directly introduced into the electronic apparatus placement area 114 through the first opening 141, which can effectively prevent the air from heating up in the process in which the air does not enter the electronic apparatus placement area 114 and improve the heat dissipation effect of the electronic apparatus 20 in the electronic apparatus placement area 114. In addition, the first baffle 142 and the second baffle 143 can further prevent the air that passes through the electronic apparatus placement area 114 from flowing back and mixing with the air that enters from the air inlet component 15 to heat the air that enters from the air inlet component 15, thereby greatly improving the heat dissipation effect of the heat dissipation cabinet 10.

In this embodiment, a width of the first opening 141 in a direction from the bottom wall 112 to the top wall 111 is less than or equal to a width of the electronic apparatus placement area 114 from the bottom wall 112 to the top wall 111, so as to effectively avoid a case that the air does not directly enter the electronic apparatus placement area 114 caused by an excessive large first opening 141, and prevent the air that passes through the electronic apparatus placement area 114 from flowing back and mixing with the air that enters from the air inlet component 15 to heat the air that enters from the air inlet component 15, thereby effectively improving the heat dissipation effect of the heat dissipation cabinet 10. Certainly, in another embodiment, when a heat dissipation requirement is not high, the width of the first opening 141 in the direction from the bottom wall 112 to the top wall 111 may alternatively be greater than the width of the electronic apparatus placement area 114 from the bottom wall 112 to the top wall 111.

Figure 6:
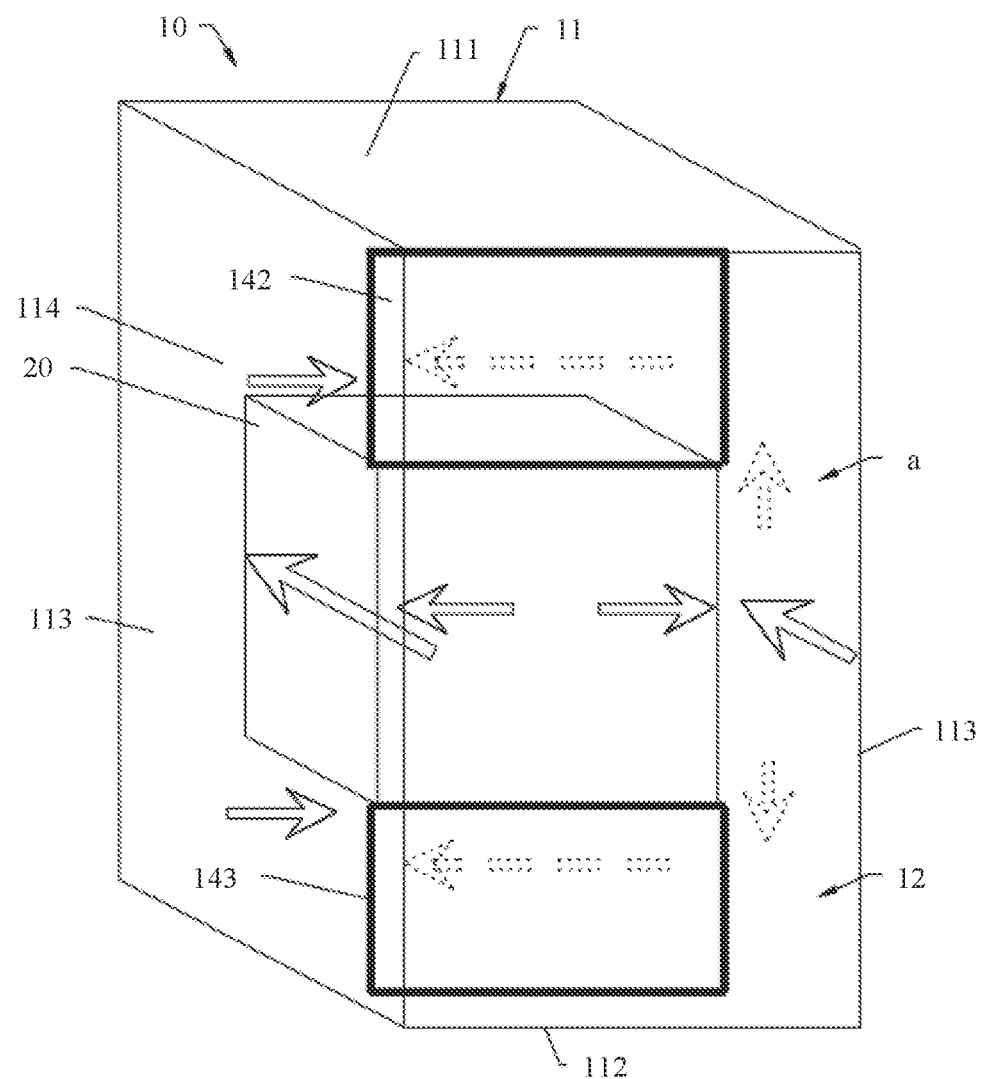
FIG. 6 is a schematic diagram of another flow direction of air in a cabinet body.

FIG. 6 is a schematic diagram of another flow direction of air in a cabinet body. Some structures of the heat dissipation cabinet 10 are not shown in FIG. 6. Please refer to FIG. 2. A gap a is formed between the side wall 113 and each of the first baffle 142 and the second baffle 143. Specifically, a gap a is formed between the baffle 15 and each of two side walls 13 adjacent to the baffle 15, so that the air enters through the air inlet component 15 enters the electronic apparatus placement area 114 through the gap a. For the electronic apparatus 20 in which the direction of the internal air duct is parallel to a direction between two side walls 113 connected to the cabinet door 12, it may be understood that, for example, the cabinet door 12 is the front side, the two side walls 113 connected to the cabinet door 12 are respectively a left side wall and a right side wall. The direction of the internal air duct of the electronic apparatus 20 is a direction from the left side wall to the right side wall, or the direction of the internal air duct of the electronic apparatus 20 is a direction from the right side wall to the left side wall. When the electronic apparatus 20 is cooled, the air that enters through the air inlet component 15 enters the position of the side wall 113 of the cabinet body 11 mainly by passing through the first baffle 142 and the second baffle 143 and bypassing the gap a, and then enters the internal air duct of the electronic apparatus 20, so that the electronic apparatus 20 can be cooled quickly (a solid arrow part in FIG. 6). After the air that passes through the electronic apparatus 20 is discharged from the electronic apparatus 20, some may flow back through the upper side and the lower side of the electronic apparatus 20, that is, through the side that faces toward the top wall 111 and the side that faces toward the bottom wall 112 (a dashed arrow part in FIG. 6), and the back-flow air cannot mix with the air that enters from the air inlet component 15 because of disposing of the first baffle 142 and the second baffle 143. That is, in this application, the air enters the electronic apparatus 20 along the internal air duct of the electronic apparatus 20 to perform heat dissipation, so that the electronic apparatus 20 can be quickly and effectively cooled, and the heat dissipation effect of the electronic apparatus 20 can be improved. In addition, the first baffle 142 and the second baffle 143 can further prevent the air that passes through the electronic apparatus placement area 114 from flowing back and mixing with the air that enters from the air inlet component 15 to heat the air that enters from the air inlet component 15, thereby greatly improving the heat dissipation effect of the heat dissipation cabinet 10. For the electronic apparatus 20 in which the direction of the internal air duct is the direction from the left side wall to the right side wall or the direction from the right side wall to the left side wall, because the direction of the internal air duct of the electronic apparatus 20 is not from the front to the rear, that is, there is no air inlet passage at the first opening 141 in the electronic apparatus 20, and therefore, the air that enters from the air inlet component 15 does not enter the electronic apparatus 20 through the first opening 141 between the first baffle 142 and the second baffle 143, but enters the electronic apparatus placement area 114 through the gap a, and further enters the internal air duct of the electronic apparatus 20 to cool the electronic apparatus 20. Disposing manners of the first baffle 142 and the second baffle 143 in this application have a good heat dissipation effect on electronic apparatuses 20 with different directions of internal air ducts, and are widely applied. A gap is formed between the second baffle 143 and the bottom wall 112, so that the air that enters through the air inlet component 15 enters the bottom wall 112 to cool a related heat emitting part disposed on the bottom wall 112. Certainly, in another embodiment, a gap is formed between the baffle 15 and one of the side walls 13. For the electronic apparatus 20 in which the direction of the internal air duct is parallel to the direction between the two side walls 113 connected to the cabinet door 12, the first opening may not be disposed between the first baffle 142 and the second baffle 143. The second baffle 143 may alternatively be connected to the bottom wall 112.

Referring to FIG. 2, the air outlet passage 13 includes a body 131 and an air duct 132 that penetrates the body 131. The body 131 is fixed to a part of the bearing frame that is close to the top wall 111, and the first baffle 141 is connected to the body 131. Two opposite ends of the body 131 include a second opening 1311 and a third opening 1312 that communicate with the air duct 132. Specifically, the second opening 1311 and the third opening 1312 are disposed opposite to each other in a direction toward the cabinet door 12, the second opening 1311 communicates with the air outlet component 16, and the third opening 1312 is located above the electronic apparatus placement area 114. The above part of the electronic apparatus disposition area 113 is in a direction in which the electronic apparatus disposition area 113 faces toward the top wall 111. The third opening 1312 is located between the top wall 111 and the electronic apparatus placement area 114, so as to quickly collect and discharge the air that passes through the electronic apparatus placement area 114 out of the cabinet body 11 through the air duct 132, and prevent hot air from flowing back to the electronic apparatus placement area 114. In addition, air that enters the air duct 132 is isolated from air outside the air duct 132, thereby effectively improving the heat dissipation effect of the heat dissipation cabinet 10. The body 131 is disposed on the bearing frame, so as to avoid introducing a new structure to fix the body 131, simplify a structure of the heat dissipation cabinet 10, and reduce production costs of the beat dissipation cabinet 10. Certainly, in another embodiment, the third opening 1312 may alternatively be placed toward the electronic apparatus placement area 114. An extractor fan may further be disposed in the air duct 132.

In this embodiment, there is one air outlet component 16. The air outlet component 16 includes a second mask 161 and a second waterproof part 162. The second mask 161 includes a sixth opening 1611 and a seventh opening 1612 that are located at two ends of the second mask 161 and communicate with the inside of the second mask 161. The second mask 161 is located on the inner side 121 of the cabinet door 12. The seventh opening 1612 communicates with the second opening 1311 of the air outlet passage 13, and the sixth opening 1611 communicates with the air outlet of the cabinet door 12. That is, the air outlet component 16 does not protrude from the outer side 122 of the cabinet door 12, so as to ensure a clean appearance of the heat dissipation cabinet 10, and avoid bump and damage of the air outlet component 16 during transportation and use. For example, the second waterproof part 162 is a waterproof structure such as a water barrier. The second waterproof part 162 is configured to prevent water from entering the cabinet body 11, so as to prevent water from affecting the electrical performance of the electronic apparatus 20 in the cabinet body 11, and improve the service life of the electronic apparatus 20. Certainly, in another embodiment, a quantity of air outlet components 16 may be set based on an actual requirement, so as to implement different heat dissipation requirements. A dustproof part may be further disposed in the air outlet component 16. The air outlet component 16 may alternatively be disposed on the outer side 122 of the cabinet door 12, or a part of the air outlet component 16 is located on the inner side 121 of the cabinet door 12, and a part thereof is located on the outer side 122 of the cabinet door 12.

The heat dissipation cabinet 10 further includes a temperature sensor (not shown in the figure) and a controller (not shown in the figure). The temperature sensor is disposed in the electronic apparatus placement area 114, and the controller is disposed in the accommodating space. The controller is electrically connected to the temperature sensor and the air inlet fan 153, so as to control a rotation speed of the air inlet fan 153 based on temperature of the electronic apparatus 20, so as to implement automatic control of a heat dissipation system and improve user experience.

Figure 7:
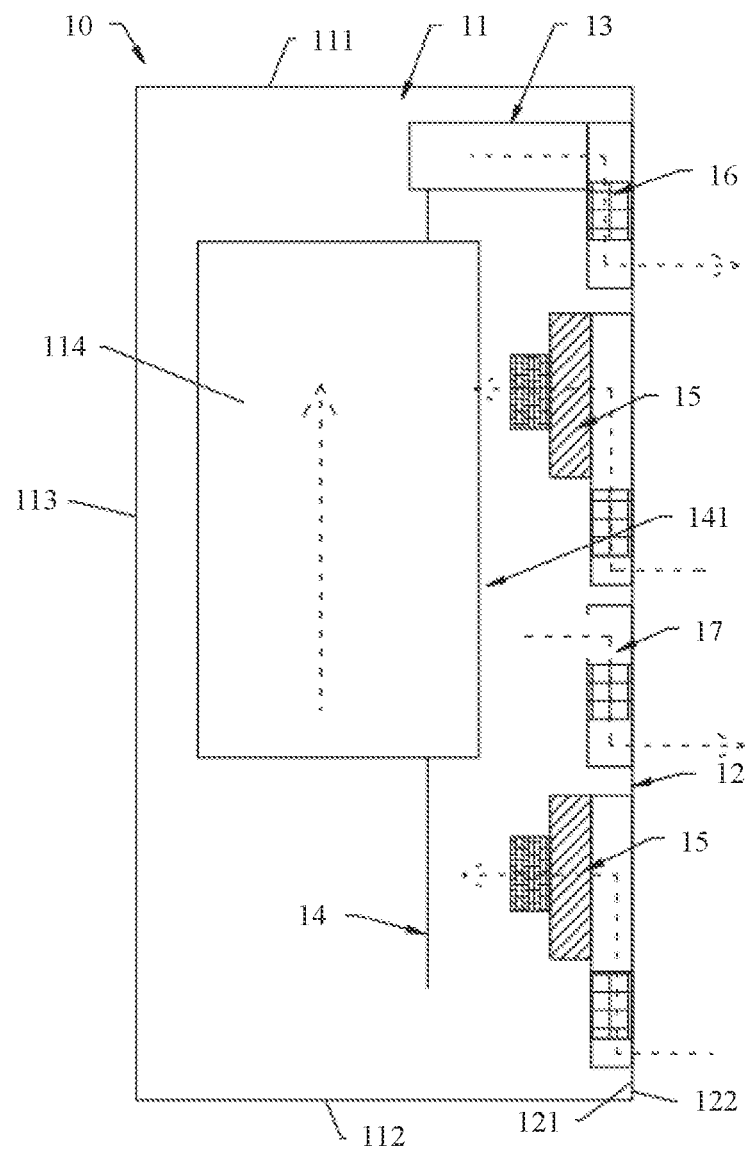
FIG. 7 is a schematic diagram of a structure of a second embodiment of a heat dissipation cabinet according to an embodiment of this application.

FIG. 7 is a schematic diagram of a structure of a second embodiment of a heat dissipation cabinet according to an embodiment of this application. A heat dissipation cabinet 10 includes a cabinet body 11, a cabinet door 12, an air outlet passage 13, and a baffle 14. The cabinet body 11 includes a top wall 11l and a bottom wall 112 that are oppositely disposed, and a side wall 113 connected between the top wall 11l and the bottom wall 112. The cabinet door 12 is installed at a position of the side wall 113 in the cabinet body 11, and can be opened and closed relative to the cabinet body 11. The air outlet passage 13 is disposed in the cabinet body 11 and is close to the top wall 111. An air inlet component 15 and an air outlet component 16 are disposed in the cabinet door 12. The air outlet component 16 is located between the air inlet component 15 and the top wall 111, and is located at one end of the air outlet passage 13. The electronic apparatus placement area 114 is disposed in the cabinet body 11, and the electronic apparatus placement area 114 is located on a side of the air outlet passage 13 that is close to the bottom wall 112. The baffle 14 is disposed between the electronic apparatus placement area 114 and the cabinet door 12, and the baffle 14 includes a first opening 141, so that air that enters through the air inlet component 15 directly enters the electronic apparatus placement area 114 through the first opening 141. In this embodiment, the heat dissipation cabinet 10 further includes an auxiliary air outlet component 17. The auxiliary air outlet component 17 is disposed in the middle of the cabinet door 12 and is located between the two air inlet components 15. There is one auxiliary air outlet component 17, and a structure of the auxiliary air outlet component 17 is the same as a structure of the air outlet component 16. An air outlet communicating with the auxiliary air outlet component 17 is disposed on the cabinet door 12, so as to discharge air in the cabinet body 11 through the auxiliary air outlet component 17. The auxiliary air outlet component 17 is disposed so that air that passes through the electronic apparatus located on the bottom wall 112 can be discharged out of the cabinet body 11 through the auxiliary air outlet component 17, so as to prevent hot air from being transmitted step by step between different electronic apparatuses and further affecting heat dissipation effects of other electronic apparatuses, thereby effectively improving an overall heat dissipation effect of a plurality of electronic apparatuses. Certainly, in another embodiment, a quantity and locations of auxiliary air outlet components 17 may alternatively be set based on an actual requirement, and the auxiliary air outlet component 17 may alternatively be switched to an auxiliary air inlet component by disposing a fan.

Figure 8:
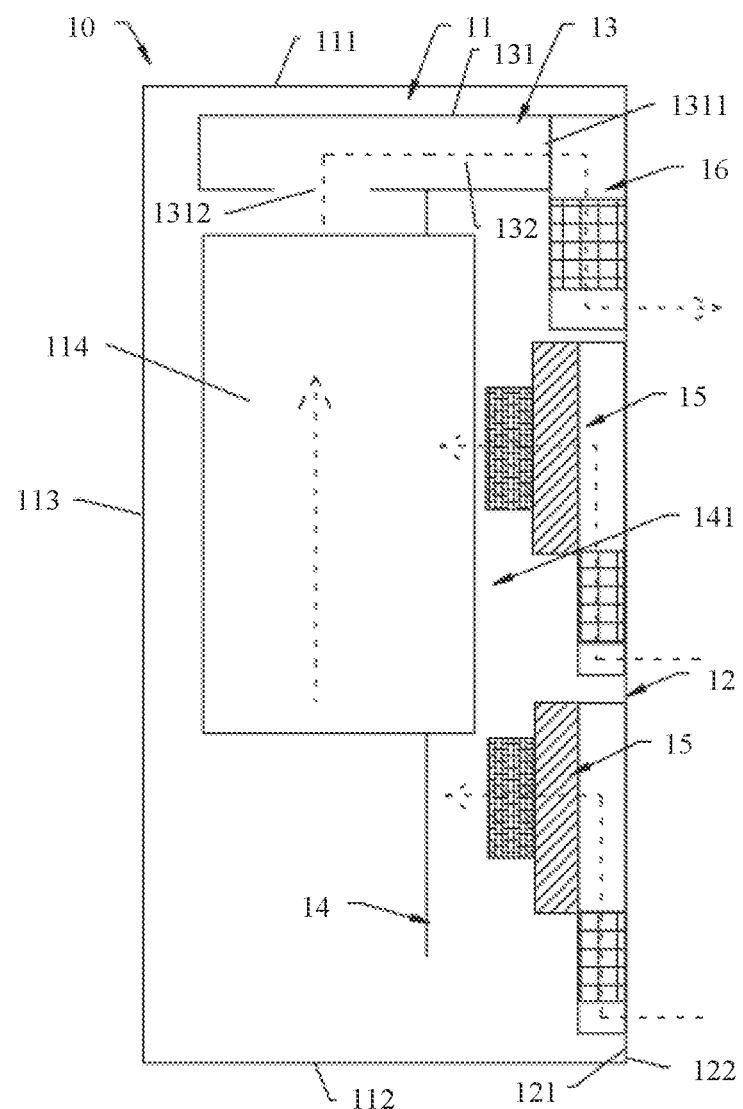
FIG. 8 is a schematic diagram of a structure of a third embodiment of a heat dissipation cabinet according to an embodiment of this application.

FIG. 8 is a schematic diagram of a structure of a third embodiment of a heat dissipation cabinet according to an embodiment of this application. A heat dissipation cabinet 10 includes a cabinet body 11, a cabinet door 12, an air outlet passage 13, and a baffle 14. The cabinet body 11 includes a top wall 111 and a bottom wall 112 that are oppositely disposed, and a side wall 113 connected between the top wall 111 and the bottom wall 112. The cabinet door 12 is installed at a position of the side wall 113 in the cabinet body 11, and can be opened and closed relative to the cabinet body 11. The air outlet passage 13 is disposed in the cabinet body 11 and is close to the top wall 111. An air inlet component 15 and an air outlet component 16 are disposed in the cabinet door 12. The air outlet component 16 is located between the air inlet component 15 and the top wall 111, and is located at one end of the air outlet passage 13. The electronic apparatus placement area 114 is disposed in the cabinet body 11, and the electronic apparatus placement area 114 is located on a side of the air outlet passage 13 that is close to the bottom wall 112. The baffle 14 is disposed between the electronic apparatus placement area 114 and the cabinet door 12, and the baffle 14 includes a first opening 141, so that air that enters through the air inlet component 15 directly enters the electronic apparatus placement area 114 through the first opening 141. In this embodiment, the air outlet passage 13 includes a body 131 and an air duct 132 that penetrates the body 131. The body 131 is fixed to a part of a bearing frame that is close to the top wall 111. Two opposite ends of the body 131 include a second opening 1311 and a third opening 1312 that communicate with the air duct 132. The second opening 1311 communicates with the air outlet component 16, and the third opening 1312 is located above the electronic apparatus placement area 114. Specifically, the third opening 1312 is disposed toward the electronic apparatus placement area 114, that is, the third opening 1312 is disposed toward air that passes through the electronic apparatus placement area 114, so as to effectively and quickly collect and discharge the air that passes through the electronic apparatus placement area 114 out of the cabinet body 11, and prevent hot air from flowing back to the electronic apparatus placement area 114, thereby effectively improving a heat dissipation effect of the heat dissipation cabinet 10. Certainly, in another embodiment, the heat dissipation cabinet 10 includes an auxiliary air outlet component. An extractor fan may further be disposed in the air duct 132.

Figure 9:
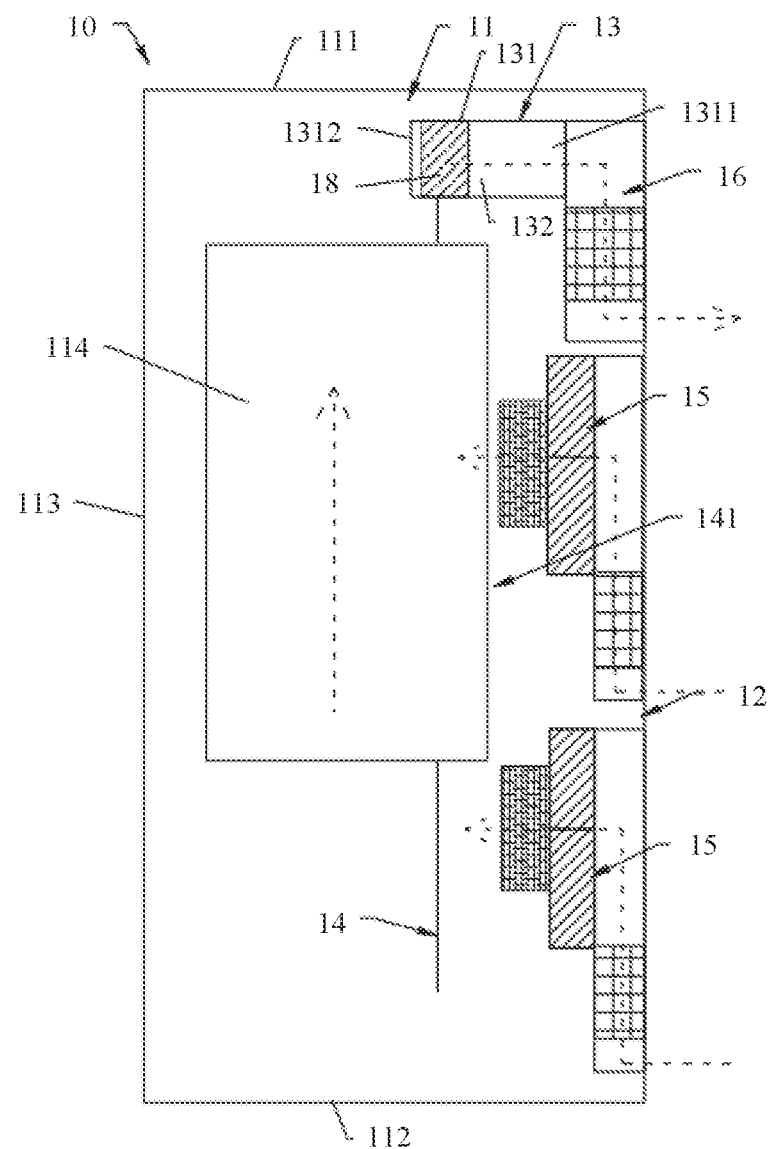
FIG. 9 is a schematic diagram of a structure of a fourth embodiment of a heat dissipation cabinet according to an embodiment of this application.
Figure 10:
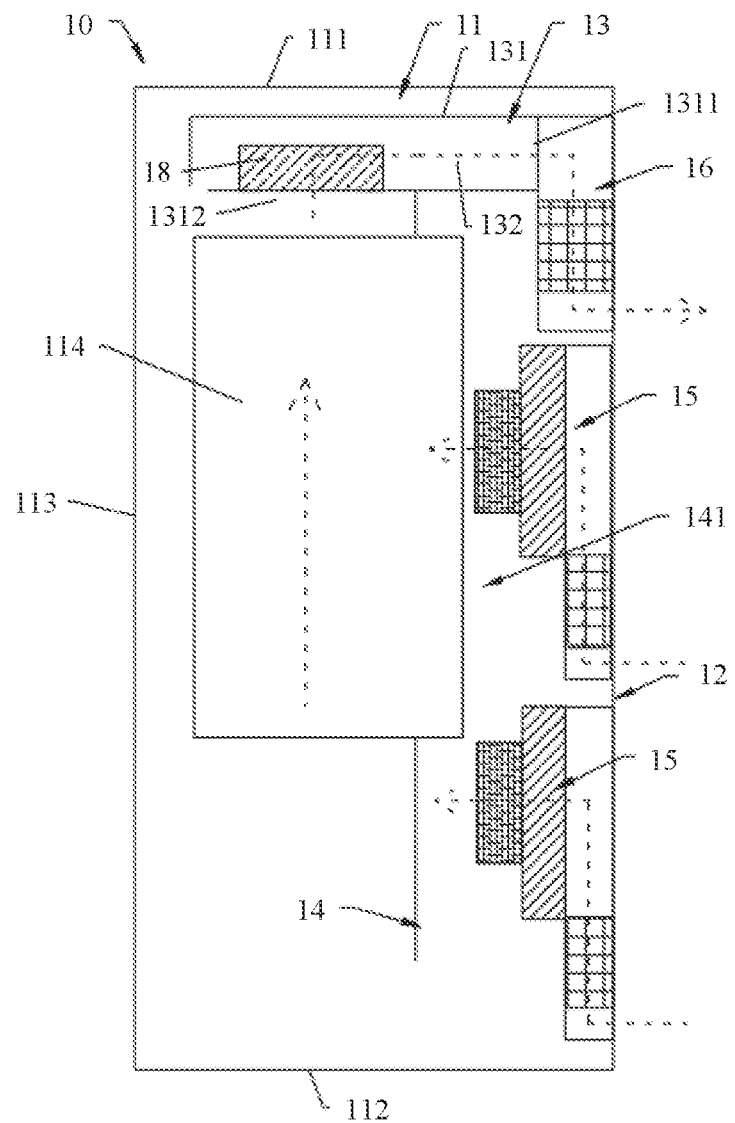
FIG. 10 is a schematic diagram of a structure of another embodiment of the heat dissipation cabinet according to FIG. 9.

FIG. 9 is a schematic diagram of a structure of a fourth embodiment of a heat dissipation cabinet according to an embodiment of this application. A heat dissipation cabinet 10 includes a cabinet body 11, a cabinet door 12, an air outlet passage 13, and a baffle 14. The cabinet body 11 includes a top wall 111 and a bottom wall 112 that are oppositely disposed, and a side wall 113 connected between the top wall 111 and the bottom wall 112. The cabinet door 12 is installed at a position of the side wall 113 in the cabinet body 11, and can be opened and closed relative to the cabinet body 11. The air outlet passage 13 is disposed in the cabinet body 11 and is close to the top wall 111. An air inlet component 15 and an air outlet component 16 are disposed in the cabinet door 12. The air outlet component 16 is located between the air inlet component 15 and the top wall 111, and is located at one end of the air outlet passage 13. The electronic apparatus placement area 114 is disposed in the cabinet body 11, and the electronic apparatus placement area 114 is located on a side of the air outlet passage 13 that is close to the bottom wall 112. The baffle 14 is disposed between the electronic apparatus placement area 114 and the cabinet door 12, and the baffle 14 includes a first opening 141, so that air that enters through the air inlet component 15 directly enters the electronic apparatus placement area 114 through the first opening 141. In this embodiment, the air outlet passage 13 includes a body 131 and an air duct 132 that penetrates the body 131. The body 131 is fixed to a part of a bearing frame that is close to the top wall 111. Two opposite ends of the body 131 include a second opening 1311 and a third opening 1312 that communicate with the air duct 132. The second opening 1311 and the third opening 1312 are disposed opposite to each other in a direction toward the cabinet door 12, the second opening 1311 communicates with the air outlet component 16, and the third opening 1312 is located above the electronic apparatus placement area 114. One extractor fan is disposed in the air outlet passage 13. Specifically, the extractor fan is disposed in the air duct 132 and is disposed close to the third opening 1312, so as to extract air that passes through the electronic apparatus placement area 114. An extractor fan 18 is disposed in the air outlet passage 13, so as to more effectively and quickly collect and discharge the air that passes through the electronic apparatus placement area 114 out of the cabinet body 11, thereby improving a heat dissipation effect of the electronic apparatus in the electronic apparatus placement area 114. The extractor fan 18 is connected to a controller to control a switch and a rotation speed of the extractor fan 18 by using the controller. Certainly, in another embodiment, a quantity and locations of extractor fans 18 may alternatively be set based on an actual requirement, and the third opening is disposed toward the electronic apparatus placement area 114 (as shown in FIG. 10). The heat dissipation cabinet 10 includes an auxiliary air outlet component.

Figure 11:
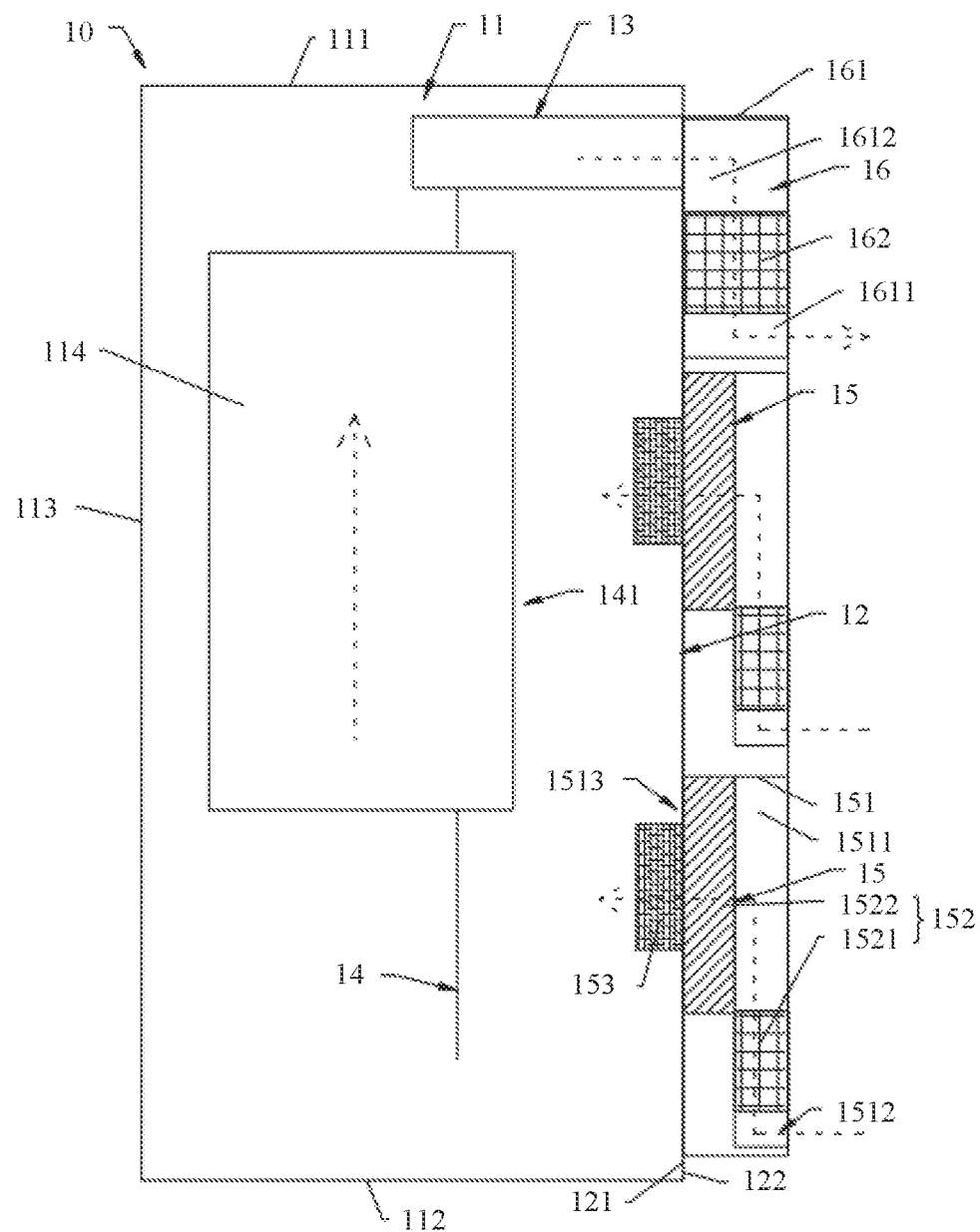
FIG. 11 is a schematic diagram of a structure of a fifth embodiment of a heat dissipation cabinet according to an embodiment of this application.

FIG. 11 is a schematic diagram of a structure of a fifth embodiment of a heat dissipation cabinet according to an embodiment of this application. A heat dissipation cabinet 10 includes a cabinet body 11, a cabinet door 12, an air outlet passage 13, and a baffle 14. The cabinet body 11 includes a top wall 111 and a bottom wall 112 that are oppositely disposed, and a side wall 113 connected between the top wall 111 and the bottom wall 112. The cabinet door 12 is installed at a position of the side wall 113 in the cabinet body 11, and can be opened and closed relative to the cabinet body 11. The air outlet passage 13 is disposed in the cabinet body 11 and is close to the top wall 111. An air inlet component 15 and an air outlet component 16 are disposed in the cabinet door 12. The air outlet component 16 is located between the air inlet component 15 and the top wall 111, and is located at one end of the air outlet passage 13. The electronic apparatus placement area 114 is disposed in the cabinet body 11, and the electronic apparatus placement area 114 is located on a side of the air outlet passage 13 that is close to the bottom wall 112. The baffle 14 is disposed between the electronic apparatus placement area 114 and the cabinet door 12, and the baffle 14 includes a first opening 141, so that air that enters through the air inlet component 15 directly enters the electronic apparatus placement area 114 through the first opening 141.

In this embodiment, the air inlet component 15 includes a first mask 151, a filter 152, and an air inlet fan 153. The first mask 151 includes accommodating space 1511, and a fourth opening 1512 and a fifth opening 1513 that are located at two opposite ends of the first mask 151 and that communicate with the accommodating space 1511. The air inlet fan 153 is disposed on a fifth opening 1513 side, the filter 152 is located in the accommodating space 1511, and is located on a side of the air inlet fan 153 that faces toward the fifth opening 1513. The air inlet fan 153 draws the air outside the cabinet body 11 into the cabinet body 11. Specifically, a part of the first mask 151 is located on an inner side 121 of the cabinet door 12, and a part thereof is located on an outer side 122 of the cabinet door 12. The fourth opening 1512 is located on the outer side 122 of the cabinet door 12, and the fifth opening 1513 is located on the inner side 121 of the cabinet door 12. Therefore, the air inlet component 15 does not occupy excessive space in the cabinet body 11, and a capacity of the cabinet body 11 is ensured. In addition, a part of the air inlet component 15 protrudes from the outer side 122 of the cabinet door 12, so as to ensure a clean appearance of the heat dissipation cabinet 10, and facilitate transportation of the heat dissipation cabinet 10, thereby avoiding bump and damage of the air inlet component 15 during transportation and use.

The air outlet component 16 includes a second mask 161 and a second waterproof part 162. The second mask 161 includes a sixth opening 1611 and a seventh opening 1612 that are located at two ends of the second mask 161 and communicate with the inside of the second mask 161. A part of the second mask 161 is located on the inner side 121 of the cabinet door 12, and a part thereof is located on the outer side 122 of the cabinet door 12. The sixth opening 1611 is located on the outer side 122 of the cabinet door 12, and the seventh opening 1612 is located on the inner side 121 of the cabinet door 12. Therefore, the air outlet component 16 does not occupy excessive space in the cabinet body 11, and the capacity of the cabinet body 11 is ensured. In addition, a part of the air outlet component 16 protrudes from the outer side 122 of the cabinet door 12, so as to ensure a clean appearance of the heat dissipation cabinet 10, and facilitate transportation of the heat dissipation cabinet 10, thereby avoiding bump and damage of the air outlet component 16 during transportation and use. Certainly, in another embodiment, the air outlet component 16 and the air inlet component 15 may alternatively be disposed on the inner side 121 of the cabinet door 12 or on the outer side 122 of the cabinet door 12. The heat dissipation cabinet 10 includes an auxiliary air outlet component. An extractor fan may further be disposed in the air duct 132.

Figure 12:
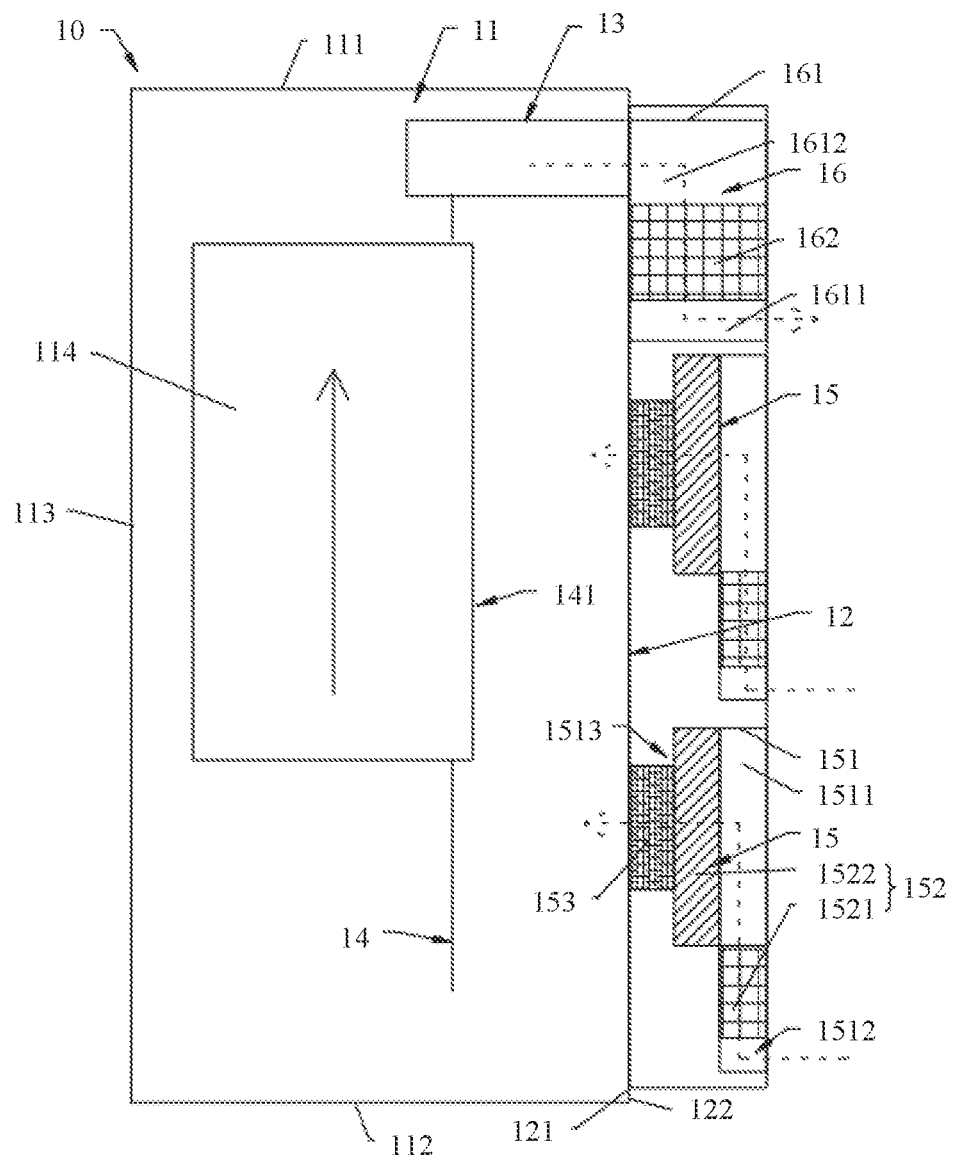
FIG. 12 is a schematic diagram of a structure of a fifth embodiment of a heat dissipation cabinet according to an embodiment of this application.

FIG. 12 is a schematic diagram of a structure of a fifth embodiment of a heat dissipation cabinet according to an embodiment of this application. A heat dissipation cabinet 10 includes a cabinet body 11, a cabinet door 12, an air outlet passage 13, and a baffle 14. The cabinet body 11 includes a top wall 111 and a bottom wall 112 that are oppositely disposed, and a side wall 113 connected between the top wall 111 and the bottom wall 112. The cabinet door 12 is installed at a position of the side wall 113 in the cabinet body 11, and can be opened and closed relative to the cabinet body 11. The air outlet passage 13 is disposed in the cabinet body 11 and is close to the top wall 111. An air inlet component 15 and an air outlet component 16 are disposed in the cabinet door 12. The air outlet component 16 is located between the air inlet component 15 and the top wall 111, and is located at one end of the air outlet passage 13. The electronic apparatus placement area 114 is disposed in the cabinet body 11, and the electronic apparatus placement area 114 is located on a side of the air outlet passage 13 that is close to the bottom wall 112. The baffle 14 is disposed between the electronic apparatus placement area 114 and the cabinet door 12, and the baffle 14 includes a first opening 141, so that air that enters through the air inlet component 15 directly enters the electronic apparatus placement area 114 through the first opening 141.

In this embodiment, the air inlet component 15 includes a first mask 151, a filter 152, and an air inlet fan 153. The first mask 151 includes accommodating space 1511, and a fourth opening 1512 and a fifth opening 1513 that are located at two opposite ends of the first mask 151 and that communicate with the accommodating space 1511. The air inlet fan 153 is disposed on a fifth opening 1513 side, the filter 152 is located in the accommodating space 1511, and is located on a side of the air inlet fan 153 that faces toward the fifth opening 1513. The air inlet fan 153 draws the air outside the cabinet body 11 into the cabinet body 11. Specifically, the first mask 151 is located on an outer side 122 of the cabinet door 12, and the fifth opening 1513 communicates with an air inlet of the cabinet door 12. That is, the air inlet component 15 does not occupy space in the cabinet body 11, so as to ensure that the space in the cabinet body 11 is large enough to meet a large capacity requirement of a customer.

The air outlet component 16 includes a second mask 161 and a second waterproof part 162. The second mask 161 includes a sixth opening 1611 and a seventh opening 1612 that are located at two ends of the second mask 161 and communicate with the inside of the second mask 161. The second mask 161 is located on the outer side 122 of the cabinet door 12, and the seventh opening 1612 communicates with an air outlet of the cabinet door 12. That is, the air outlet component 16 does not occupy the space in the cabinet body 11, so as to ensure that the space in the cabinet body 11 is large enough to meet the large capacity requirement of the customer. Certainly, in another embodiment, the air outlet component 16 and the air inlet component 15 may alternatively be disposed on an inner side 121 of the cabinet door 12, or parts of the air outlet component 16 and the air inlet component 15 are disposed on the outer side 122 of the cabinet door 12, and parts thereof are disposed on the inner side 121 of the cabinet door 12. The heat dissipation cabinet 10 includes an auxiliary air outlet component. An extractor fan may further be disposed in the air duct 132.

Figure 13:
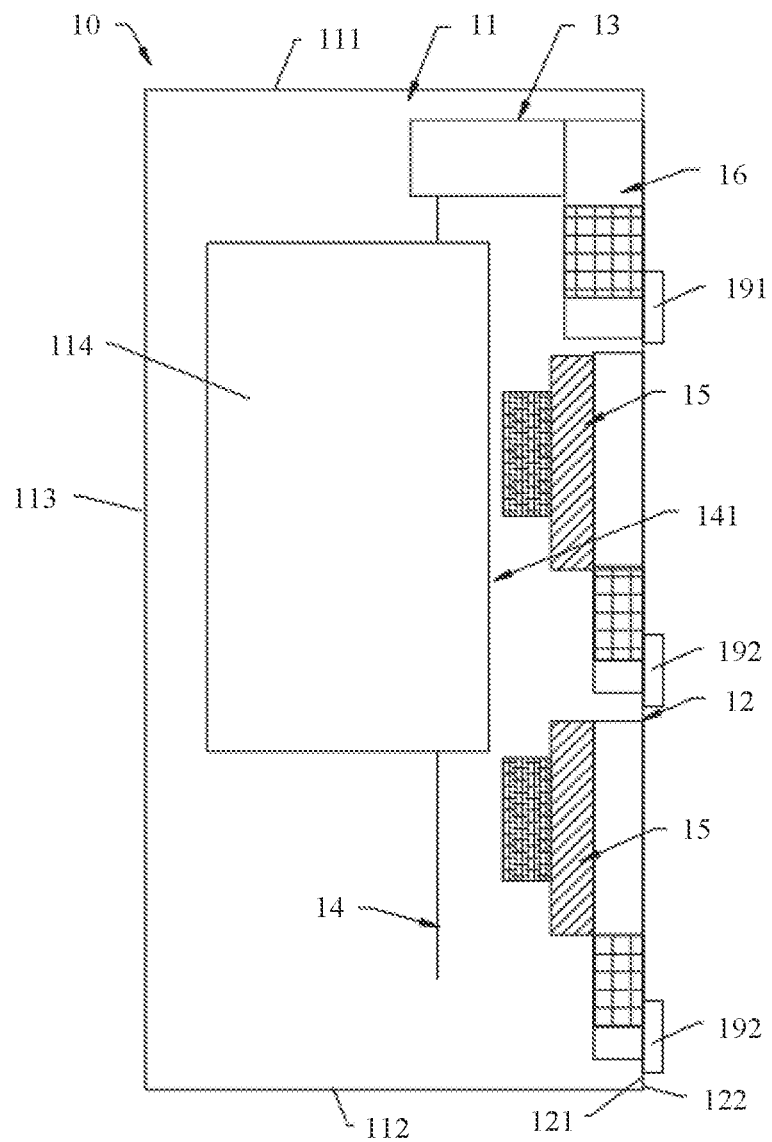
FIG. 13 is a schematic diagram of a structure of a sixth embodiment of a heat dissipation cabinet according to an embodiment of this application.

FIG. 13 is a schematic diagram of a structure of a sixth embodiment of a heat dissipation cabinet according to an embodiment of this application. A heat dissipation cabinet 10 includes a cabinet body 11, a cabinet door 12, an air outlet passage 13, and a baffle 14. The cabinet body 11 includes a top wall 111 and a bottom wall 112 that are oppositely disposed, and a side wall 113 connected between the top wall 111 and the bottom wall 112. The cabinet door 12 is installed at a position of the side wall 113 in the cabinet body 11, and can be opened and closed relative to the cabinet body 11. The air outlet passage 13 is disposed in the cabinet body 11 and is close to the top wall 111. An air inlet component 15 and an air outlet component 16 are disposed in the cabinet door 12. The air outlet component 16 is located between the air inlet component 15 and the top wall 111, and is located at one end of the air outlet passage 13. The electronic apparatus placement area 114 is disposed in the cabinet body 11, and the electronic apparatus placement area 114 is located on a side of the air outlet passage 13 that is close to the bottom wall 112. The baffle 14 is disposed between the electronic apparatus placement area 114 and the cabinet door 12, and the baffle 14 includes a first opening 141, so that air that enters through the air inlet component 15 directly enters the electronic apparatus placement area 114 through the first opening 141.

In this embodiment, the cabinet door 12 is connected to a first cover plate 191 and a second cover plate 192. The first cover plate 191 and the second cover plate 192 are slidably connected to the cabinet door 12. The first cover plate 191 is configured to open or close the air outlet component 16, and the second cover plate 192 is configured to open or close the air inlet component 15. That is, the air inlet component 15 or the air outlet component 16 that are not in use may be closed, so as to ensure sealing in the cabinet body 11, effectively control air flow in the cabinet body 11, improve a heat dissipation effect of the heat dissipation cabinet 10, and reduce energy consumption of the heat dissipation cabinet 10 during use, thereby reducing use costs. In this embodiment, there is one first cover plate 191 and one air outlet component 16, and there are two second cover plates 192 and two air inlet components 15. Certainly, in another embodiment, a connection manner between each of the first cover plate 191 and the second cover plate 192 and the cabinet door 12 may be another connection manner such as rotational connection. A quantity of air outlet components 16 and a quantity of air inlet components 15 may alternatively be set based on an actual requirement. A quantity of first cover plates 191 may be less than the quantity of air outlet components 16, and a quantity of second cover plates 192 may be less than the quantity of air inlet components 15, that is, not all the air outlet components 16 and the air inlet components 15 are provided with cover plates.

Specifically, a driving part (not shown in the figure) is disposed in the cabinet door 12, and the driving part is connected to a controller, the first cover plate 191, and the second cover plate 192 to drive the first cover plate 191 and the second cover plate 192 to respectively open or close the air outlet component 16 and the air inlet component 15, so that the first cover plate 191 and the second cover plate 192 can be automatically controlled by using the controller, and user experience is improved. Certainly, in another embodiment, the first cover plate and the second cover plate may alternatively be disposed on the air outlet component 16 or the air inlet component 15, and may be located at any position of the air outlet component 16 or the air inlet component 15. The air outlet component 16 and the air inlet component 15 may alternatively be disposed on an outer side 122 of the cabinet door 12, or parts of the air outlet component 16 and the air inlet component 15 are disposed on the outer side 122 of the cabinet door 12, and parts thereof are disposed on an inner side 121 of the cabinet door 12. The heat dissipation cabinet 10 further includes an auxiliary air outlet component and/or an extractor fan. The extractor fan is disposed in the air outlet passage, and the auxiliary air outlet component may be opened or closed under control of the cover plate.

The protection scope in this application is not limited to the first embodiment to the sixth embodiment, and any combination of the first embodiment to the sixth embodiment is also within the protection scope of this application, that is, the plurality of embodiments described above may be randomly combined based on actual needs.

In the heat dissipation cabinet 10 in this embodiment of this application, the baffle 14 is disposed between the electronic apparatus placement area 114 and the cabinet door 12, so that the air that enters through the air inlet component 15 directly enters the electronic apparatus placement area 114 through the first opening 141, so as to cool the electronic apparatus 20 disposed in the electronic apparatus placement area 114. In addition, the air outlet passage 13 is disposed at a position of the cabinet body 11 that is close to the top wall 111, so that air that passes through the electronic apparatus 20 is led from the air outlet passage 13 to the air outlet component 16, and further the air (hot air) that passes through the electronic apparatus 20 is discharged out of the cabinet body 11 through the air outlet component 16. That is, the air outlet passage 13 in this application can quickly and effectively collect and discharge the heated air that passes through the electronic apparatus 20 out of the cabinet body 11, thereby effectively improving a heat dissipation effect of the heat dissipation cabinet 10 and ensuring the electrical performance of the electronic apparatus 20 disposed in the heat dissipation cabinet 10. In other words, in this application, external air (cold air) is directly introducing into the electronic apparatus placement area 114 by using the baffle 14, so as to prevent the external air from diffusing in any direction in the cabinet body 11, and finally entering the electronic apparatus placement area 114. In this process, temperature of the external air rises gradually, and finally, when the external air arrives at the electronic apparatus placement area 20, there is a problem that the heat dissipation effect of the electronic apparatus 20 in the electronic apparatus placement area 114 is not good. Directly introducing the external air into the electronic apparatus placement area 114 can effectively prevent the air from heating up in a process in which the air does not enter the electronic apparatus placement area 114, and by disposing the air outlet passage 13, air (hot air) that passes through the electronic apparatus placement area 114 can be rapidly discharged out of the cabinet body 11, thereby effectively preventing the hot air from flowing back to the electronic apparatus placement area 114, improving the heat dissipation effect of the electronic apparatus 20 in the electronic apparatus placement area 114, and ensuring effective operation of the electronic apparatus 20. The baffle 14 can further prevent the air (hot air) that passes through the electronic apparatus placement area 114 from flowing back and mixing with the air (cold air) that enters from the air inlet component 15, thereby greatly improving the heat dissipation effect of the heat dissipation cabinet 10. Temperature control apparatuses such as the air inlet component 15 and the air outlet component 16 in this application are all disposed on the cabinet door 12, which facilitates maintenance. The heat dissipation cabinet 10 can further be smoothly switched among a direct ventilation system, a heat exchange system, and an air conditioner system by changing different forms of cabinet doors 12, so as to meet different scenario requirements of a user, reduce maintenance costs, reduce user usage costs, and improve user experience.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A heat dissipation cabinet, comprising:
a cabinet body, a cabinet door, and a baffle, wherein:
the cabinet body comprises a top wall and a bottom wall that are oppositely disposed, and a side wall connected between the top wall and the bottom wall, the cabinet door is installed at a position of the side wall in the cabinet body, and an air outlet passage is disposed in the cabinet body that is close to a position of the top wall;
an air inlet component and an air outlet component are disposed in the cabinet door, and the air outlet component is located between the air inlet component and the top wall, and is located at one end of the air outlet passage;
an electronic apparatus placement area is disposed in the cabinet body, and the baffle is disposed between the electronic apparatus placement area and the cabinet door;
the air outlet passage comprises a body and an air duct that penetrates the body, wherein two opposite ends of the body comprise a second opening and a third opening that communicate with the air duct, the second opening communicates with the air outlet component, and the third opening is located above the electronic apparatus placement area; and
the baffle comprises a first opening, wherein air that enters through the air inlet component directly enters the electronic apparatus placement area through the first opening.

2. The heat dissipation cabinet according to claim 1, wherein the second opening and the third opening are disposed opposite to each other in a direction toward the cabinet door.

3. The heat dissipation cabinet according to claim 1, wherein the third opening is disposed toward the electronic apparatus placement area.

4. The heat dissipation cabinet according to claim 2, wherein at least one extractor fan is disposed in the air outlet passage, and the at least one extractor fan is configured to extract the air that passes through the electronic apparatus placement area.

5. The heat dissipation cabinet according to claim 1, wherein:
the baffle comprises a first baffle and a second baffle, and the first opening is located between the first baffle and the second baffle;
the first baffle is disposed adjacent to the body; and
the second baffle is located between the first baffle and the bottom wall.

6. The heat dissipation cabinet according to claim 5, wherein a width of the first opening in a direction from the bottom wall to the top wall is less than or equal to a width of the electronic apparatus placement area from the bottom wall to the top wall.

7. The heat dissipation cabinet according to claim 6, wherein a gap is formed between the side wall and each of the first baffle and the second baffle, wherein the air that enters through the air inlet component enters the electronic apparatus placement area through the gap.

8. The heat dissipation cabinet according to claim 1, wherein:
the air inlet component comprises a first mask and an air inlet fan;
the first mask comprises accommodating space,
a fourth opening and a fifth opening are located at two opposite ends of the first mask, and communicate with the accommodating space; and
the air inlet fan is disposed on the fifth opening side, and the air inlet fan draws air outside the cabinet body into the cabinet body.

9. The heat dissipation cabinet according to claim 8, wherein:
a part of the first mask is located on an inner side of the cabinet door, and a part thereof is located on an outer side of the cabinet door; and
the fourth opening is located on the outer side of the cabinet door, and the fifth opening is located on the inner side of the cabinet door.

10. The heat dissipation cabinet according to claim 8, wherein:
the first mask is located on an inner side of the cabinet door, and the fourth opening communicates with an air inlet of the cabinet door; or
the first mask is located on an outer side of the cabinet door, and the fifth opening communicates with an air inlet of the cabinet door.

11. The heat dissipation cabinet according to claim 9, wherein the air inlet component further comprises a filter, and the filter is located in the accommodating space and is located on a side of the air inlet fan that faces toward the fifth opening.

12. The heat dissipation cabinet according to claim 11, wherein:
the filter comprises a dustproof part and a first waterproof part; and
the dustproof part is disposed closer to the air inlet fan relative to the first waterproof part; or
the first waterproof part is disposed closer to the air inlet fan relative to the dustproof part.

13. The heat dissipation cabinet according to claim 1, wherein the heat dissipation cabinet further comprises a bearing frame, the bearing frame is installed in the cabinet body, an area of the bearing frame that is used to dispose a related electronic apparatus is the electronic apparatus placement area, and the body is fixed to a part of the bearing frame that is close to the top wall.

14. The heat dissipation cabinet according to claim 1, wherein the heat dissipation cabinet further comprises an auxiliary air outlet component, and the auxiliary air outlet component is disposed in the middle of the cabinet door.

15. A communication device, wherein the communication device comprises:
an electronic apparatus and a heat dissipation cabinet, wherein:
the electronic apparatus is disposed in an electronic apparatus placement area of the heat dissipation cabinet; and
the heat dissipation cabinet comprises a cabinet body, a cabinet door, and a baffle, wherein:
the cabinet body comprises a top wall and a bottom wall that are oppositely disposed, and a side wall connected between the top wall and the bottom wall;
the cabinet door is installed at a position of the side wall in the cabinet body, and an air outlet passage is disposed in the cabinet body that is close to a position of the top wall;
an air inlet component and an air outlet component are disposed in the cabinet door, and the air outlet component is located between the air inlet component and the top wall, and is located at one end of the air outlet passage;

the electronic apparatus placement area is disposed in the cabinet body, and the baffle is disposed between the electronic apparatus placement area and the cabinet door;

the air outlet passage comprises a body and an air duct that penetrates the body, wherein two opposite ends of the body comprise a second opening and a third opening that communicate with the air duct, the second opening communicates with the air outlet component, and the third opening is located above the electronic apparatus placement area; and the baffle comprises a first opening, wherein air that enters through the air inlet component directly enters the electronic apparatus placement area through the first opening.

16. The communication device of claim 15, wherein the second opening and the third opening are disposed opposite to each other in a direction toward the cabinet door.

17. The communication device of claim 15, wherein the third opening is disposed toward the electronic apparatus placement area.

18. The communication device of claim 17, wherein at least one extractor fan is disposed in the air outlet passage, and the at least one extractor fan is configured to extract the air that passes through the electronic apparatus placement area.

* * * * *

UNITED STATES PATENT AND TRADEMARK OFFICE
CERTIFICATE OF CORRECTION

| | |
|---|---|
| PATENT NO. | : 12,245,403 B2 |
| APPLICATION NO. | : 17/981129 |
| DATED | : March 4, 2025 |
| INVENTOR(S) | : Zhisheng Lian, Tao Feng and Shulong Xu |

Page 1 of 1

It is certified that error appears in the above-identified patent and that said Letters Patent is hereby corrected as shown below:

On the Title Page

Item [56], Line 1, Delete "Appln" and insert -- Appln --.

Signed and Sealed this
Twenty-second Day of July, 2025

Coke Morgan Stewart
*Acting Director of the United States Patent and Trademark Office*